United States Patent
Horita

(10) Patent No.: US 8,587,085 B2
(45) Date of Patent: Nov. 19, 2013

(54) SEMICONDUCTOR DEVICE WITH TRENCH ISOLATION HAVING A DIFFUSION PREVENTING FILM AND MANUFACTURING METHOD THEREOF

(75) Inventor: Katsuyuki Horita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 196 days.

(21) Appl. No.: 13/286,699

(22) Filed: Nov. 1, 2011

(65) Prior Publication Data
US 2012/0119309 A1   May 17, 2012

(30) Foreign Application Priority Data
Nov. 17, 2010   (JP) .................................. 2010-256693

(51) Int. Cl.
  *H01L 21/76*   (2006.01)
  *H01L 21/70*   (2006.01)

(52) U.S. Cl.
  USPC ........... 257/510; 257/506; 257/520; 257/523; 257/499; 438/400; 438/424; 438/425; 438/426; 438/427; 438/430; 438/435

(58) Field of Classification Search
  USPC .......... 257/506, 510, 520, 523, 499, E21.546, 257/E21.547, E21.263, E21.282, E21.548, 257/E21.572; 438/400, 424, 425, 426, 427, 438/430, 435
  See application file for complete search history.

(56) References Cited

U.S. PATENT DOCUMENTS

| | | | |
|---|---|---|---|
| 4,835,115 A * | 5/1989 | Eklund | 438/426 |
| 6,331,472 B1 | 12/2001 | Liu et al. | |
| 6,750,526 B2 * | 6/2004 | Nakashima | 257/509 |
| 7,645,679 B2 | 1/2010 | Chun | |
| 8,129,816 B2 * | 3/2012 | Matsuno | 257/506 |
| 2007/0111470 A1 | 5/2007 | Smythe, III et al. | |
| 2010/0044802 A1 * | 2/2010 | Ishibashi et al. | 257/401 |

* cited by examiner

*Primary Examiner* — Chuong A Luu
*Assistant Examiner* — Cory Eskridge
(74) *Attorney, Agent, or Firm* — McDermott Will & Emery LLP

(57) ABSTRACT

There is provided a technology capable of providing desirable operation characteristics in a field effect transistor formed in an active region surrounded by a trench type element isolation part. An element isolation part includes trench type element isolation films, diffusion preventive films each including a silicon film or a silicon oxide film, and having a thickness of 10 to 20 nm formed over the top surfaces of the trench type element isolation films, and silicon oxide films each with a thickness of 0.5 to 2 nm formed over the top surfaces of the diffusion preventive films. The composition of the diffusion preventive film is $SiO_x$ ($0 \leq x < 2$). Each composition of the trench type element isolation films and the silicon oxide films is set to be $SiO_2$.

20 Claims, 23 Drawing Sheets

SEMICONDUCTOR DEVICE WITH TRENCH ISOLATION HAVING A DIFFUSION PREVENTING FILM AND MANUFACTURING METHOD THEREOF

CROSS-REFERENCE TO RELATED APPLICATIONS

The disclosure of Japanese Patent Application No. 2010-256693 filed on Nov. 17, 2010 including the specification, drawings and abstract is incorporated herein by reference in its entirety.

BACKGROUND

The present invention relates to a semiconductor device and a manufacturing technology thereof. More particularly, it relates to a semiconductor device having a field effect transistor formed in an active region surrounded by a trench type element isolation part formed in a main surface of a semiconductor substrate, and a technology effectively applicable to manufacturing thereof.

With miniaturization of semiconductor elements for use in LSI (Large Scale Integration), miniaturization of an element isolation part for electrically isolating respective semiconductor elements also proceeds. In recent years, there has been widely used for LSI, the trench isolation method which can be expected to achieve higher integration and to have a more improved isolation capability as compared with the LOCOS (Local Oxidation of Silicon) method.

For example, US Patent Application No. 2007/0111470 (Patent Document 1) discloses the following method: at the inner wall of a trench, a silicon nitride film (liner layer) is formed; then, only at the bottom of the trench, an oxide film (oxide layer) is formed; subsequently, the inside of the trench is filled with a silicon oxide film (silicon oxide layer), thereby to form a trench type element isolation part.

Further U.S. Pat. No. 7,645,679 (Patent Document 2) discloses the following method: at the inner wall of a trench, a thermal oxidation film (thermal oxidation layer) is formed; further, thereover, a silicon-rich oxide film (silicon rich oxide) is formed; then, the inside of the trench is filled with an oxide film (oxidation isolation layer), thereby to form a trench type element isolation part.

Still further, U.S. Pat. No. 6,331,472 (Patent Document 3) discloses the following method: at the inner wall of a trench, an oxide film (oxide layer) and a silicon-rich oxide film (silicon-rich oxide) are stacked; then, the inside of the trench is filled with a silicon oxide film (silicon oxide), and the surface is polished, thereby to form a trench type element isolation part in which the top surface of the silicon oxide film embedded in the inside of the trench is flat.

[Patent Document 1]
U.S. Patent Application No. 2007/0111470
[Patent Document 2]
U.S. Pat. No. 7,645,679
[Patent Document 3]
U.S. Pat. No. 6,331,472

SUMMARY

However, a trench type element isolation method has various technical problems described below.

For example, when a plurality of field effect transistors having gate insulation films with mutually different thicknesses are manufactured, in a step of forming the gate insulation films with mutually different thicknesses, a wet etching method is repeatedly used. However, under the influence of repeated use of the wet etching method, a divot may occur in the end of the top surface of a trench type element isolation film embedded in the inside of the trench. When the gate insulation films and the gate electrodes come into the divot, the end of a main surface of a semiconductor substrate in an active region surrounded by the trench type element isolation film is surrounded by the gate insulation films and the gate electrodes. For this reason, when each field effect transistor operates, an electric field from the gate electrode strongly acts on the end of the main surface of the semiconductor substrate in the active region. Accordingly, an inversion layer becomes more likely to be formed, which unfavorably results in reduction of the threshold voltage of the field effect transistor.

Further, when a plurality of field effect transistors having gate insulation films with mutually different thicknesses are manufactured, in a step of forming the gate insulation films with mutually different thicknesses, a thermal oxidation method is repeatedly used. However, oxidized species such as oxidized molecules or water molecules for use in the thermal oxidation are diffused in the trench type element isolation film. Thus, an oxidation reaction may proceed between the trench type element isolation film and the semiconductor substrate. At this step, the trench type element isolation film swells in volume by the volume of the oxide film formed by the oxidation reaction. As a result, a stress is caused in the active region surrounded by the trench type element isolation film. The stress changes the speed (i.e., mobility) of electrons in the semiconductor substrate, resulting in a change in operation speed of the field effect transistor. This causes malfunctions such as the integrated circuit becoming incapable of operating at a desired speed.

Further, in recent years, in order to improve the driving capability, a study has been conducted on the adoption of a field effect transistor in which a gate insulation film includes a High-k material, and a gate electrode includes a metal material. However, in the field effect transistor, the oxidized species released from the trench type element isolation film are diffused into the High-k material forming the gate insulation film, and the metal material forming the gate electrode. This unfavorably results in variation in threshold voltage.

It is an object of the present invention to provide a technology capable of providing desired operation characteristics in a field effect transistor formed in an active region surrounded by a trench type element isolation part.

The foregoing and other objects and novel features of the present invention will be apparent from the description of this specification and the accompanying drawings.

One embodiment of the representative ones of the inventions disclosed in the present application will be described in brief as follows.

The embodiment is a semiconductor device having an element isolation part including a trench formed in a prescribed region of a main surface of a semiconductor substrate, a trench type element isolation film embedded in the inside of the trench, a diffusion preventive film with a thickness of 10 to 20 nm formed over the top surface of the trench type element isolation film, and an overlying silicon oxide film with a thickness of 0.5 to 2 nm formed over the top surface of the diffusion preventive film; and having, in an active region of the semiconductor substrate surrounded by the element isolation part, a field effect transistor including a gate insulation film including a lamination film of an oxide film and a High-k film formed over the main surface of the semiconductor substrate, a gate electrode including a metal film formed over the top surface of the gate insulation film, and semiconductor regions formed in the semiconductor substrate on the opposite sides of the gate electrode. Each composition of the trench type element isolation film and the overlying silicon oxide film is $SiO_2$. The composition of the diffusion preventive film is $SiO_x$ ($0 \leq x < 2$).

Further, the embodiment is a method for manufacturing a semiconductor device in which field effect transistors are formed. A manufacturing step of an element isolation part for electrically isolating the field effect transistors from one another includes the steps of: forming a pad insulation film and a mask insulation film sequentially from the bottom over a main surface of a semiconductor substrate, and then, removing the mask insulation film, the pad insulation film, and the semiconductor substrate in a prescribed region, and forming a trench having a prescribed width and depth in the main surface of the semiconductor substrate; forming an inner wall oxide film at the inner wall of the trench; over the main surface of the semiconductor substrate including the inside of the trench, forming an underlying silicon oxide film, and then, with the mask insulation film as a stopper film, polishing the surface of the underlying silicon oxide film, and removing the underlying silicon oxide film in a region in which the trench is not formed; processing the underlying silicon oxide film such that the position of the top surface of the underlying silicon oxide film in a region in which the trench is formed is equal to the position of the main surface of the semiconductor substrate in which the trench is not formed, and forming a trench type element isolation film; forming a diffusion preventive film over the main surface of the semiconductor substrate, and further forming an overlying silicon oxide film thereover; with the mask insulation film as a stopper film, polishing the surface of the overlying silicon oxide film, and removing the overlying silicon oxide film in a region in which the trench is not formed, and then, removing the diffusion preventive film over the top surface of the mask insulation film; processing the overlying silicon oxide film in the region in which the trench is formed into a prescribed thickness; and removing the mask insulation film, the pad insulation film, and the diffusion preventive film at the side surfaces of the overlying silicon oxide film.

The effects obtainable by one embodiment of representative ones of the inventions disclosed in the present application will be briefly described as follows.

It is possible to obtain desirable operation characteristics in a field effect transistor formed in an active region surrounded by a trench type element isolation part.

DETAILED DESCRIPTION

Figure 1:
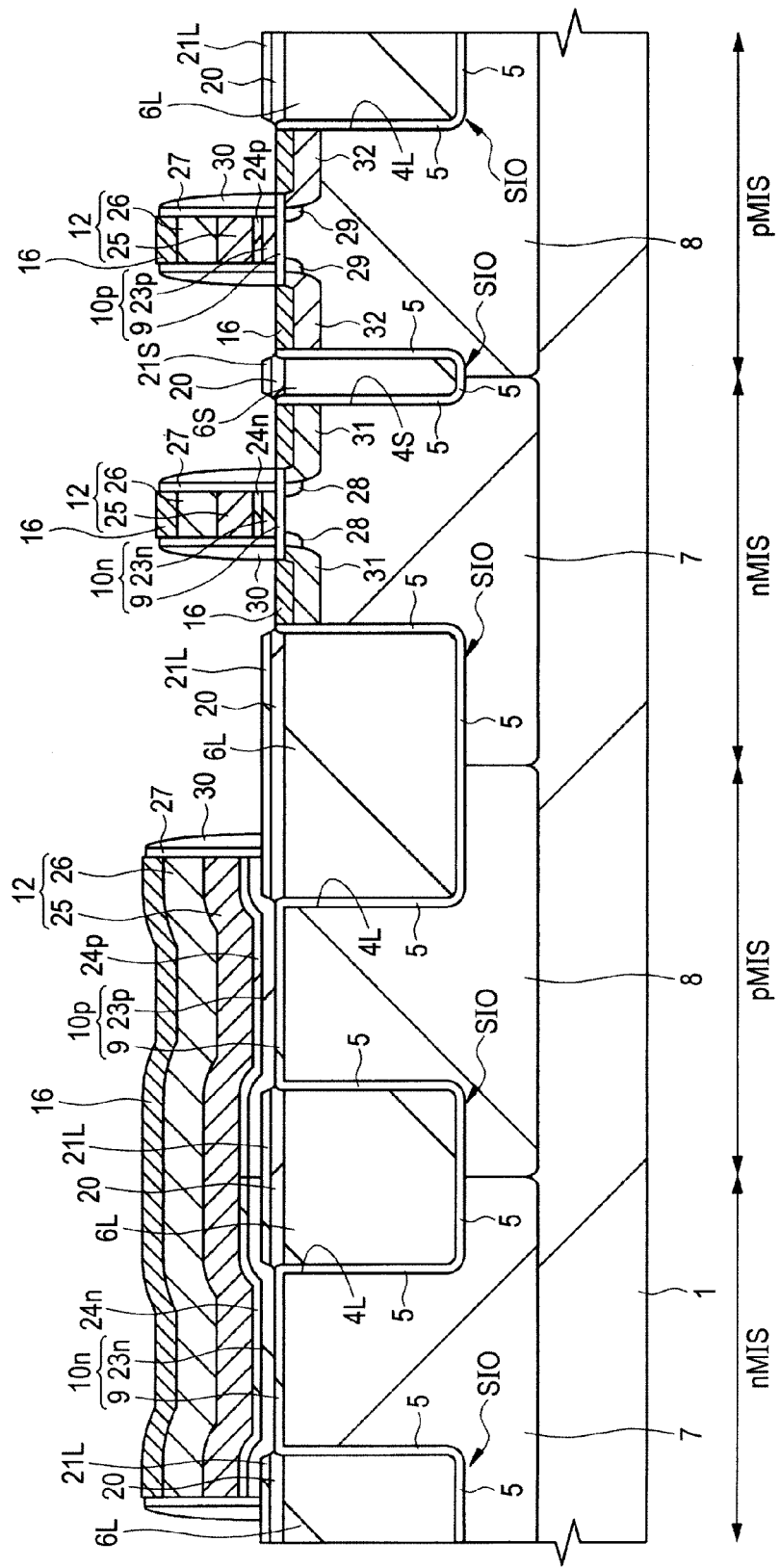
FIG. 1 is an essential part cross-sectional view along the gate length direction and the gate width direction of field effect transistors in accordance with one embodiment of the present invention, illustrating the structure of the field effect transistors.

In the following embodiment, the embodiment may be described in a plurality of divided sections or embodiments for convenience, if required. However, unless otherwise specified, these are not independent of each other, but are in a relation such that one is a modified example, detailed explanation, complementary explanation, or the like of a part or the whole of the other.

Further, in the following embodiments, when a reference is made to the number of elements, and the like (including number, numerical value, quantity, range, or the like), the number of elements is not limited to the specific number, but may be greater than or less than the specific number, unless otherwise specified, and except the case where the number is apparently limited to the specific number in principle, and other cases. Further, in the following embodiments, the constitutional elements (including element steps, or the like) are not always essential, unless otherwise specified, and except the case where they are apparently considered essential in principle, and other cases. Similarly, in the following embodiments, when a reference is made to the shapes, positional relationships, or the like of the constitutional elements, or the like, it is understood that they include ones substantially analogous or similar to the shapes or the like, unless otherwise specified, unless otherwise considered apparently in principle, and except for other cases. This also applies to the foregoing numerical values and the ranges.

Further, in the drawings for use in the following embodiments, even a plan view may be hatched for easy view of the drawing. Still further, in the following embodiments, a MISFET (Metal Insulator Semiconductor Field Effect Transistor) representative of field effect transistors is abbreviated as a MIS. A p channel type MISFET is abbreviated as a pMIS, and an n channel type MISFET is abbreviated as an nMIS. Further, in the following embodiments, the term "wafer" herein used mainly denotes a Si (Silicon) single crystal wafer, but the term "wafer" indicates not only it but also a SOI (Silicon On Insulator) wafer, an insulation film substrate for forming an integrated circuit thereover, or the like. The shape thereof is also not limited to a circle or a nearly circle, but includes a square, a rectangle, or the like.

Incidentally, in all the drawings for describing the following embodiments, the members having the same function are given the same reference signs and numerals in principle, and a repeated description thereon is omitted. Below, the embodiments of the present invention will be described in details by reference to the accompanying drawings.

First, since the structure of a trench type element isolation part in accordance with one embodiment of the present invention will be conceivably made more clear, a method for manufacturing a field effect transistor in which a gate insulation film includes a High-k material with a high relative dielectric constant, studied by the present inventors prior to the present invention will be described step by step referring to FIGS. 19 to 26A to 26C. FIGS. 19 to 25 are essential part cross-sectional views of nMISs and pMISs, and show cross-sectional views along their respective gate length directions and cross-sectional views along their respective gate length directions. FIGS. 26A, 26B, and 26C are an essential part plan view of the nMIS and the pMIS, an essential part cross-sectional view along line A-A' of FIG. 26A, and an essential part cross-sectional view along line B-B' of FIG. 26B, respectively.

Figure 19:
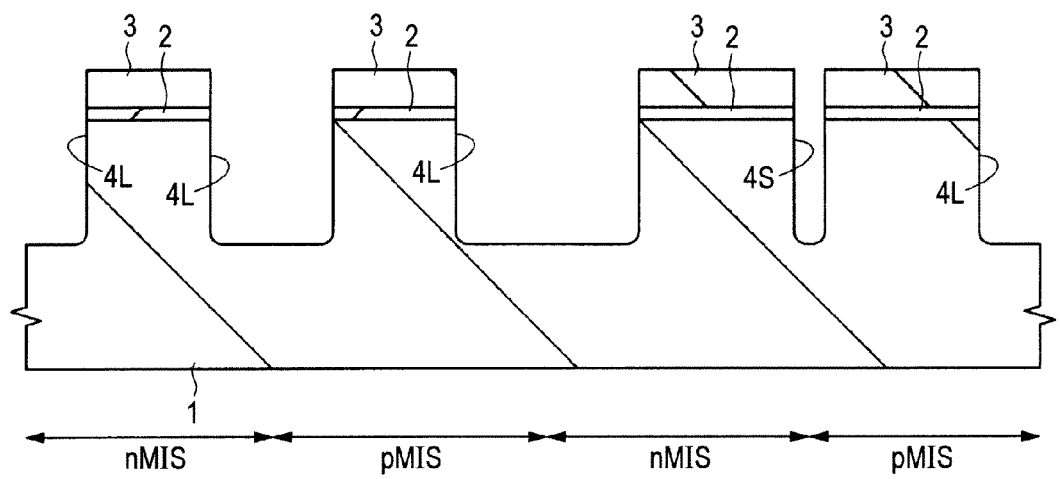
FIG. 19 is an essential part cross-sectional view along the gate length direction and the gate width direction of field effect transistors studied by the present inventors prior to the present invention, illustrating a manufacturing step of the field effect transistors.

First, as shown in FIG. 19, there is prepared a semiconductor substrate (a thin plate of a semiconductor in a generally circular shape in plan view referred to as a semiconductor wafer at this stage) 1 obtained by introducing p type impurities such as boron (B) into, for example, a single crystal silicon. Subsequently, over a main surface of the semiconductor substrate 1, a silicon oxide film 2 and a silicon nitride film 3 are sequentially formed. The thickness of the silicon oxide film 2 is, for example, about 5 to 20 nm, and the thickness of the silicon nitride film 3 is, for example, about 30 to 100 nm.

Then, using a lithography method and a dry etching method, in desirable regions of the semiconductor substrate 1, a plurality of trenches 4L and 4S having various trench widths are formed. Herein, a reference sign 4S in the drawing represents a trench having the smallest trench width, and a reference sign 4L represents a trench having a larger trench width than that. The depth of the trenches 4L and 4S is, for example, about 150 to 400 nm from the main surface of the semiconductor substrate 1. The trench width of the trench 4S having the smallest trench width is about 20 to 50 nm.

Figure 20:
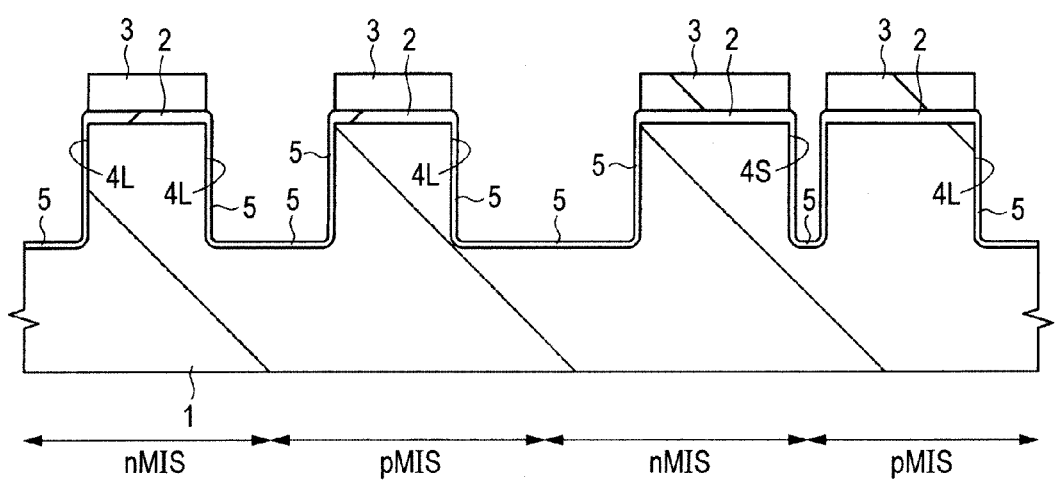
FIG. 20 is an essential part cross-sectional view of the same portion as that of FIG. 19 of each field effect transistor during a manufacturing step following that of FIG. 19.

Then, as shown in FIG. 20, the insides of the trenches 4L and 4S are washed. Then, portions of the semiconductor substrate 1 at the inner walls (the side surfaces and the bottom surfaces) of the trenches 4L and 4S are oxidized by a thermal oxidation method, thereby to form inner wall oxide films 5. The thickness of the inner wall oxide film 5 is, for example, about 3 to 10 nm.

Figure 21:
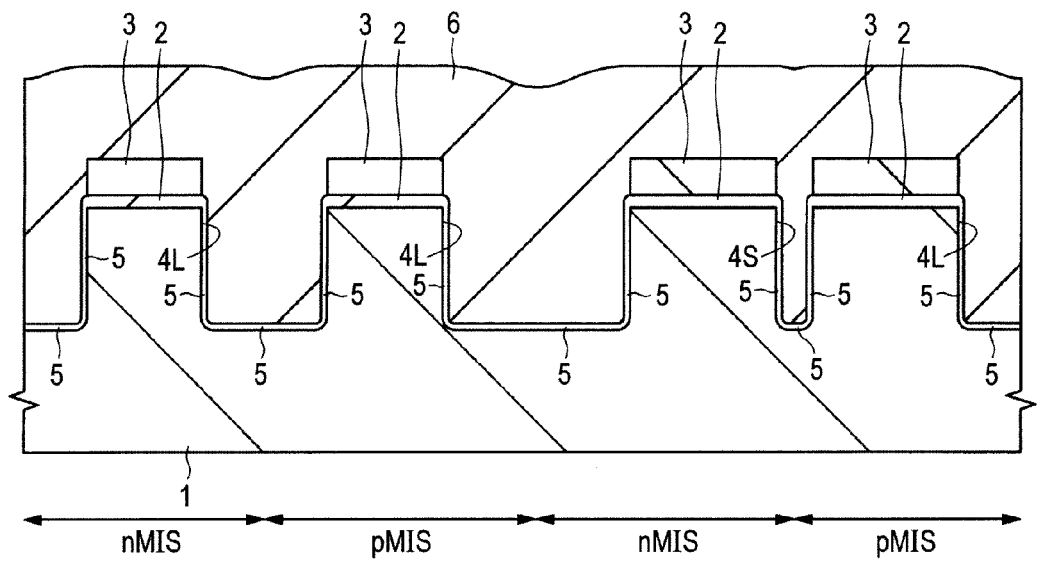
FIG. 21 is an essential part cross-sectional view of the same portion as that of FIG. 19 of the field effect transistor during a manufacturing step following that of FIG. 20.

Then, as shown in FIG. 21, using, for example, a SA-CVD (Sub-Atmospheric Chemical Vapor Deposition) method, over the main surface of the semiconductor substrate 1 including the insides of the trenches 4L and 4S, a silicon oxide film 6 is deposited. The formation method of the silicon oxide film 6 is not limited to the SA-CVD method. Other CVD methods such as a HDP-CVD (High Density Plasma Chemical Vapor Deposition) method or a coating method may be used. Further, films formed by mutually different manufacturing methods may be stacked at lower and upper parts of each inside of the trenches 4L and 4S in view of the embedding property, the film quality, and the like.

Figure 22:
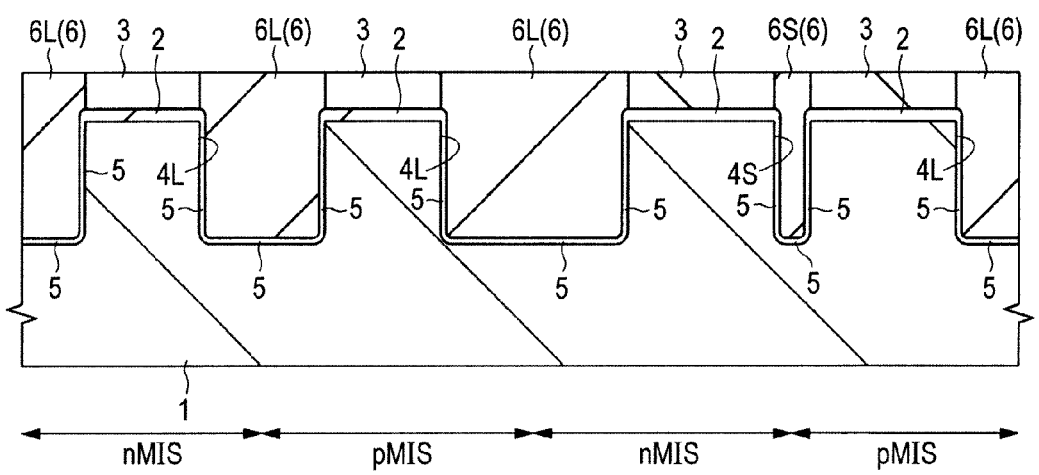
FIG. 22 is an essential part cross-sectional view of the same portion as that of FIG. 19 of the field effect transistor during a manufacturing step following that of FIG. 21.
Figure 23:
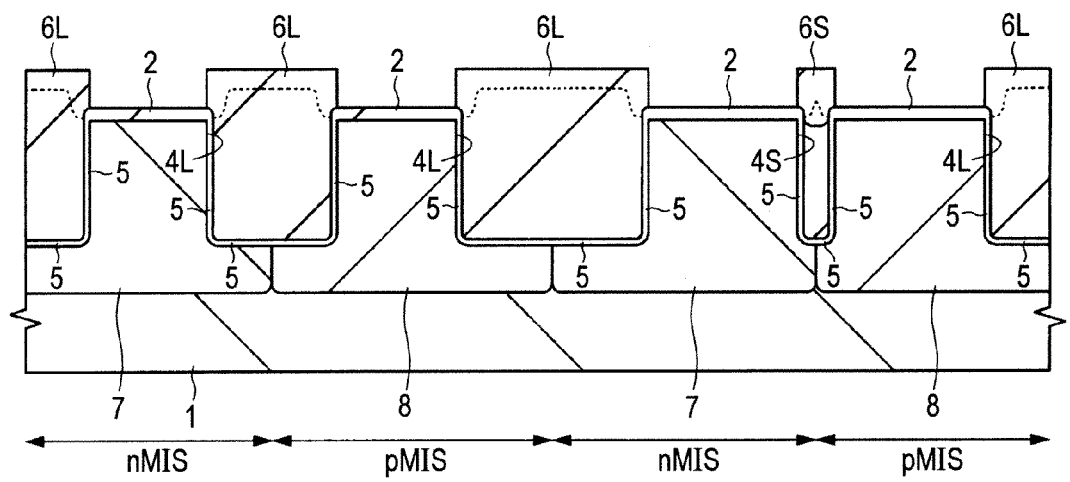
FIG. 23 is an essential part cross-sectional view of the same portion as that of FIG. 19 of the field effect transistor during a manufacturing step following that of FIG. 22.

Then, as shown in FIG. 22, using a CMP (Chemical Mechanical Polishing) method, with the silicon nitride film 3 as a stopper film, the surface of the silicon oxide film 6 is polished. As a result, in the insides of the trenches 4L and 4S, the silicon oxide film 6 is embedded, resulting in trench type element isolation films 6L and 6S. Herein, the silicon oxide film 6 embedded in the inside of the trench 4L is the trench type element isolation film 6L. The silicon oxide film 6 embedded in the trench 4S is the trench type element isolation film 6S. Then, as shown in FIG. 23, using hot phosphoric acid, the silicon nitride film 3 is removed. Then, into a portion of the semiconductor substrate 1 in each nMIS forming region, using an ion implantation method, p type impurities (e.g., boron (B)) are selectively introduced, thereby to form a p type well 7. At this step, the silicon oxide film 2 is used as a screen film. Similarly, into a portion of the semiconductor substrate 1 in each pMIS forming region, using an ion implantation method, n type impurities (e.g., phosphorus (P) or arsenic (As)) are selectively introduced, thereby to form an n type well 8. At this step, the silicon oxide film 2 is used as a screen film. Incidentally, before forming the p type well 7 and the n type well 8, the silicon oxide film 2 is once removed. At the main surface of the semiconductor substrate 1, with method such as a thermal oxidation method, another silicon oxide film is formed. This may be allowed to serve as a screen film. Subsequently, impurities for adjusting respective threshold voltages of the nMIS and the pMIS are introduced into the semiconductor substrate 1 using an ion implantation method.

Then, by a wet etching method using a solution containing hydrofluoric acid, the silicon oxide film 2 is removed. Then, by a thermal oxidation method, at the main surface of the semiconductor substrate 1, there is formed a first oxide film with a thickness of, for example, about 2 to 6 nm (not shown). The first oxide film is used for a gate insulation film of a field effect transistor used in an input/output circuit, a power circuit, or the like, and required to have a breakdown voltage as high as, for example, about 2.5 V. Then, using a lithography method and a wet etching method using a solution containing hydrofluoric acid, portions of the first oxide film are left only in desired regions, and portions of the first oxide film in other regions are removed. Incidentally, the nMIS and the pMIS herein described are formed in regions from each of which the first oxide film has been removed.

Figure 24:
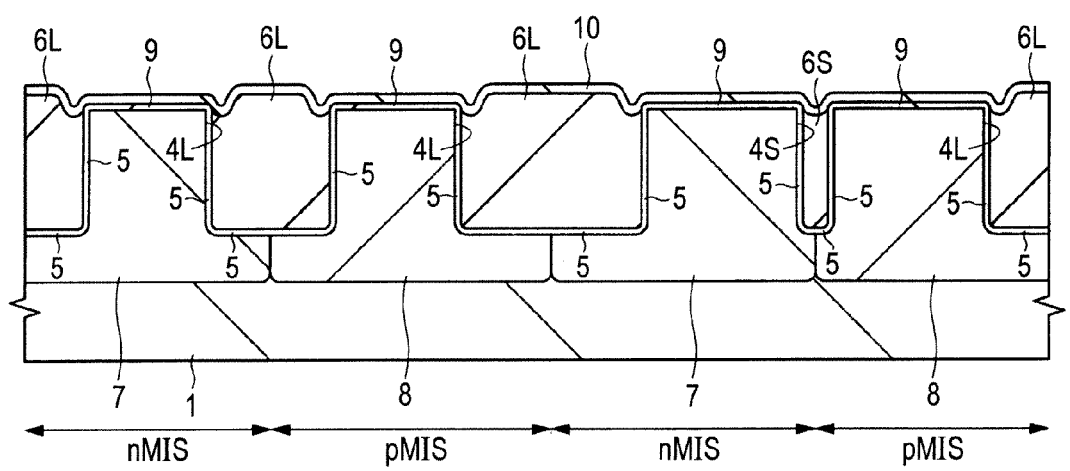
FIG. 24 is an essential part cross-sectional view of the same portion as that of FIG. 19 of the field effect transistor during a manufacturing step following that of FIG. 23.

Then, as shown in FIG. 24, at the main surface of the semiconductor substrate 1 in each region from which the first oxide film has been removed, a second oxide film 9 is formed using a thermal oxidation method or the like. The second oxide film 9 is, for example, a silicon oxide film or a silicon oxynitride film. The thickness thereof is, for example, about 0.5 to 1.5 nm. The second oxide film 9 is used for a gate insulation film of a field effect transistor to be used in a memory circuit, a processor circuit, or the like, and required to have a breakdown voltage as low as, for example, about 1.0 V. Herein, in place of the second oxide film 9 formed using a thermal oxidation method or the like, there can be also used an oxide film with a thickness of, for example, about 0.1 to 1.5 nm, deposited by natural oxidation or chemical treatment.

Herein, at the main surface of the semiconductor substrate 1, there were formed two types of the oxide films with mutually different thicknesses (the first oxide film (with a thickness of about 2 to 6 nm) and the second oxide film 9 (with a thickness of about 0.5 to 1.5 nm)). However, in order to enhance the functions of the LSI, there may be formed three or more types of oxide films with mutually different thicknesses. By repeating the lithography method and the wet etching method in the foregoing procedure, it is possible to form three or more types of oxide films with mutually different thicknesses.

Then, over the second oxide film 9, a High-k film 10 such as a hafnium oxide film ($HfO_2$) is formed using a CVD method. The thickness of the High-k film 10 is, for example, about 0.5 to 2 nm.

Figure 25:
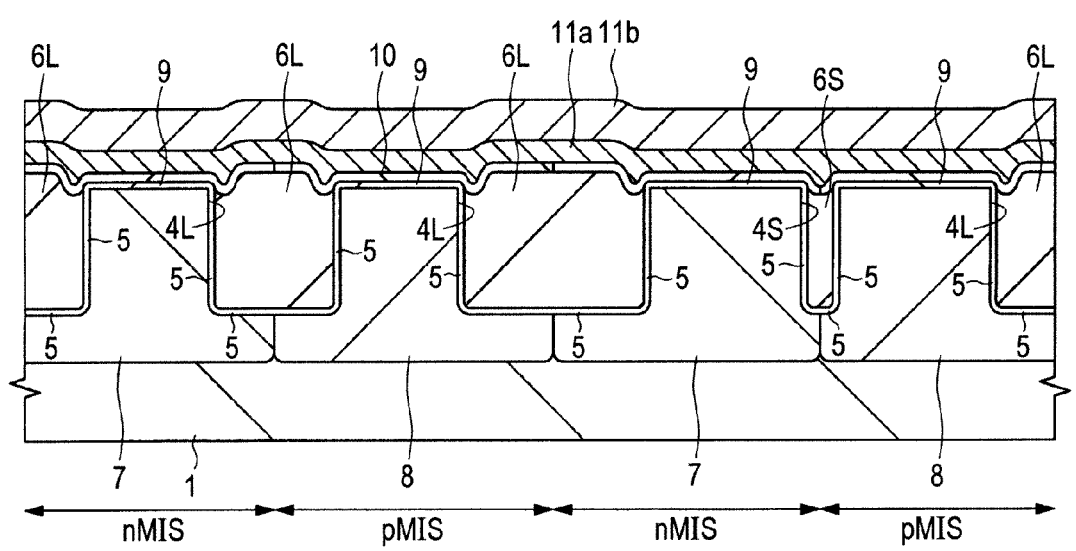
FIG. 25 is an essential part cross-sectional view of the same portion as that of FIG. 19 of the field effect transistor during a manufacturing step following that of FIG. 24.
Figure 26A:
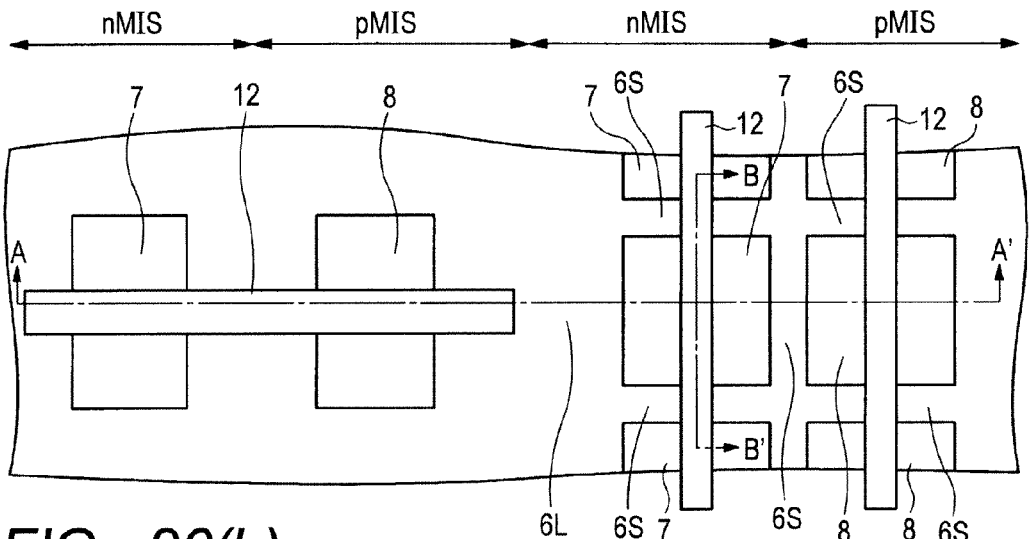
FIGS. 26A, 26B, and 26C are an essential part plan view of the field effect transistors during a manufacturing step following that of FIG. 25, an essential part cross-sectional view along line A-A' of FIG. 26A, and an essential part cross-sectional view along line B-B' of FIG. 26A, respectively.
Figure 26B:
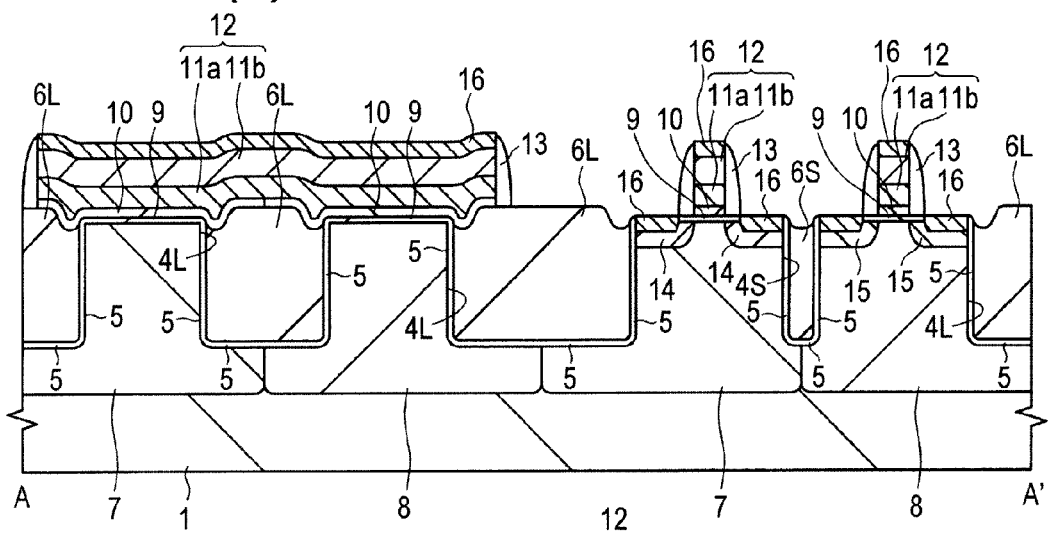
Figure 26C:
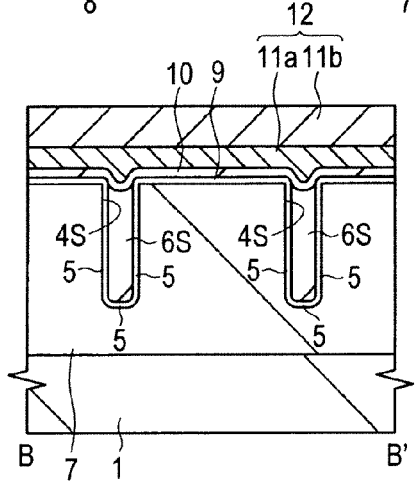

Then, as shown in FIG. 25, over the High-k film 10, a multilayer film of lamination of a metal film 11a and a polycrystalline silicon film 11B as gate electrode materials is formed via a cap film (not shown). The thickness of the multilayer film is, for example, about 50 to 100 nm.

Then, as shown in FIGS. 26A, 26B, and 26C, using a lithography method and a dry etching method, the polycrystalline silicon film 11B and the metal film 11a are processed into a prescribed shape to form a gate electrode 12. Further, the High-k film 10 is processed into a prescribed shape. Then, over the main surface of the semiconductor substrate 1, an insulation film such as a silicon nitride film is deposited. Then, using a dry etching method, the insulation film is etched back, thereby to form a sidewall 13 at the side surfaces of the gate electrode 12 and the High-k film 10.

Subsequently, n type impurities (e.g., phosphorus (P) or arsenic (As)) are introduced into the nMIS forming region using an ion implantation method in self-alignment with the gate electrode 12 and the sidewall 13, thereby to form n type semiconductor regions 14 forming source/drain. Similarly, p type impurities (e.g., boron (B) or boron fluoride ($BF_2$)) are introduced into the pMIS forming region using an ion implantation method in self-alignment with the gate electrode 12 and the sidewall 13, thereby to form p type semiconductor regions 15 forming source/drain. Then, there are formed silicide films 16 (e.g., nickel silicide) for reducing the resistances over the top surfaces of the gate electrodes 12 and the sources/drains (the n type semiconductor regions 14 of the nMIS and the p type semiconductor regions 15 of the pMIS).

Then, the nMIS and the pMIS are respectively electrically coupled with other semiconductor elements by metal wires or the like, thereby to form an integrated circuit.

However, when two types of oxide films (the first oxide film and the second oxide film 9) with mutually different thicknesses are formed, as shown in FIG. 24 described above, under the influence of use of the wet etching method, in the end of the top surface of the trench type element isolation film 6L formed in the trench 4L with a large trench width (the portion of the top surface of the trench element isolation film 6L along the side surface of the trench 4L), a divot occurs. In the trench type element isolation film 6S formed in the trench 4S with a small trench width, a divot also occurs. This results in that the trench type element isolation film 6S is in the shape with a loss in overall thickness. As indicated with dotted lines in FIG. 23 described above, the wet etching method does not damage the semiconductor substrate 1. However, by the isotropy, at the ends of the trench type element isolation films 6L and 6S, wet etching also proceeds from the exposed side surfaces of the trench type element isolation films 6L and 6S, resulting in occurrence of divots.

When the High-k film 10 comes into the divot, the end of the main surface of the semiconductor substrate 1 in the active region is surrounded by the High-k film 10 and the gate electrode 12. For this reason, when the field effect transistor operates, the electric field from the gate electrode 12 strongly acts on the end of the main surface of the semiconductor substrate 1 in the active region. Accordingly, an inversion layer becomes more likely to be formed, unfavorably resulting in reduction of the threshold voltage of the field effect transistor. In an increasingly miniaturized LSI, the ratio of divots occupying the active region in which field effect transistors are formed increases. This increases the effect of the divots exerted on the operation characteristics of the field effect transistors. Whereas, when three or more types of oxide films with mutually different thicknesses are formed, the wet etching method is repeatedly used. Accordingly, divots may be formed more deeply. This results in serious effects of the divots exerted on the operation characteristics of the field effect transistors.

Whereas, when two types of oxide films with mutually different thicknesses (the first oxide film and the second oxide film 9) are formed, the thermal oxidation method is repeatedly used. Accordingly, oxidized species such as oxidized molecules or water molecules for use in the thermal oxidation are diffused in the trench type element isolation films 6L and 6S. Thus, an oxidation reaction may proceed between the trench type element isolation films 6L and 6S and the semiconductor substrate 1. At this step, the trench type element isolation films 6L and 6S each swell in volume by the volume of the oxide film formed by the oxidation reaction. As a result, a stress is caused in the active region surrounded by the trench type element isolation films 6L and 6S. The stress changes the speed (i.e., mobility) of electrons in the semiconductor substrate 1, resulting in a change in operation speed of each field effect transistor. This causes malfunctions such as the integrated circuit becoming incapable of operating at a desired speed.

Further, the oxidized species released from the trench type element isolation films 6L and 6S may be diffused into the High-k film 10 and the metal film 11a forming the gate electrode 12. Also in this case, the threshold voltage of the field effect transistor may vary.

Embodiment

The structure of field effect transistors (nMISs and pMISs) in each of which a gate insulation film includes a High-k material with a high relative dielectric constant, and a gate electrode includes a metal material in accordance with one embodiment of the present invention will be described by reference to FIG. 1. FIG. 1 is an essential part cross-sectional view of the nMISs and the pMISs, showing cross-sectional views along their respective gate length directions, and cross-sectional views along their respective gate width directions.

In the main surface of the semiconductor substrate 1, there is formed an element isolation part SIO having a function of preventing the interference between the elements formed in the semiconductor substrate 1. The region of the semiconductor substrate 1 surrounded by the element isolation part SIO is referred to as an active region. In the active region, various semiconductor elements are formed. In the present embodiment, out of the semiconductor elements, nMISs and pMISs are shown.

The element isolation part SIO includes the trenches 4L and 4S formed in the semiconductor substrate 1, inner wall oxide films 5 formed in the inner walls (side surfaces and the bottom surfaces) of the trenches 4L and 4S, and the trench type element isolation films (underlying silicon oxide films) 6L and 6S formed via the inner wall oxide films 5 in such a manner as to fill the insides of the trenches 4L and 4S. The trench 4S is a trench having the smallest trench width. The trench 4L is a trench having a larger trench width than that of the trench 4S. The depths of the trenches 4L and 4S are, for example, about 150 to 400 nm from the main surface of the semiconductor substrate 1. The thickness of the inner wall oxide film 5 is, for example, about 3 to 10 nm. The trench type element isolation films 6L and 6S each include a silicon oxide film having a nearly stoichiometric composition ($SiO_2$). Further, the top surfaces of the trench type element isolation films 6L and 6S embedded in the insides of the trenches 4L and 4S, respectively, are flat. At each end of the top surfaces of the trench type element isolation films 6L and 6S, a divot is not formed.

Further, each top surface of the trench type element isolation films 6L and 6S embedded in the insides of the trenches 4L and 4S, respectively, is covered with a diffusion preventive film (silicon film or silicon-rich oxide film) 20. The diffusion preventive film 20 includes a silicon film or a silicon-rich oxide film. The silicon-rich oxide film is a silicon oxide film with a higher silicon ratio (a smaller oxygen ratio) than in the stoichiometric composition ($SiO_2$). The composition is expressed as a chemical formula: $SiO_x$ ($0<x<2$). The thickness of the diffusion preventive film 20 is, for example, about 3 to 20 nm. The preferable thickness is, for example, about 10 to 20 nm.

Further, the top surfaces of the diffusion preventive films 20 are covered with silicon oxide films (overlying silicon oxide films) 21L and 21S. The silicon oxide films 21L and 21S each include a silicon oxide film having a nearly stoichiometric composition ($SiO_2$). The thicknesses of the silicon oxide films 21L and 21S are, for example, about 0.5 to 2 nm. Therefore, between the trench type element isolation films 6L and 6S each having a composition of $SiO_2$ and the silicon oxide films 21L and 21S each having a composition of $SiO_2$, there are respectively formed the diffusion preventive films 20 each including a silicon film or a silicon-rich oxide film with a higher ratio of silicon to oxygen than that of the film.

Further, the positions of the top surfaces of the trench type element isolation films 6L and 6S are roughly equal to the position of the main surface of the semiconductor substrate 1 in which the trenches 4L and 4S are not formed, or lower than the position of the main surface of the semiconductor substrate 1 in which the trenches 4L and 4S are not formed by, for example, about 10 nm. Accordingly, at the boundary between the element isolation part SIO and the active region, there is caused a step difference equivalent to the total thickness of each diffusion preventive film 20 and the silicon oxide film 21L or 21S formed over the top surface of the trench type element isolation film 6L or 6S. The step difference is about 20 nm at maximum.

In the main surface of the semiconductor substrate 1 in each nMIS forming region, there is formed a p type well 7 which is a semiconductor region. In the main surface of the semiconductor substrate 1 in each pMIS forming region, there is formed an n type well 8 which is a semiconductor region.

Subsequently, the configuration of the nMIS will be described.

Over the main surface of the semiconductor substrate 1 in the nMIS forming region (p type well 7), a gate insulation film 10n is formed. The gate insulation film 10n includes a second oxide film (gate oxide film) 9 having a composition of $SiO_2$ and a High-k film 23n with a higher relative dielectric constant than that of $SiO_2$. As the High-k film 23n, there is used a hafnium type insulation film such as a hafnium oxide ($HfO_x$) film, a hafnium oxynitride (HfON) film, a hafnium silicate ($HfSiO_x$) film, or a hafnium silicate nitride (HfSiON) film. The hafnium type insulation film contains a metallic element such as lanthanum (La) for adjusting the work function and obtaining a desirable threshold voltage of the nMIS. Therefore, as the typical constituent material of the High-k film 23n, for example, hafnium lanthanum oxynitride (HfLaON) maybe mentioned. The thickness of the High-k film 23n is, for example, about 1 nm.

Further, when the semiconductor substrate 1 and the High-k film 23n are in direct contact with each other, the mobility of the nMIS may be reduced. However, by interposing the second oxide film 9 between the semiconductor substrate 1 and the High-k film 23n, it is possible to prevent the reduction of the mobility. The thickness of the second oxide film 9 is, for example, about 0.5 to 1.5 nm.

Over the top surface of the gate insulation film 10n, a cap film 24n is formed. The cap film 24n is, for example, a lanthanum oxide (LaO) film, and is formed in order to add a metallic element for obtaining the threshold voltage of the nMIS, i.e., lanthanum (La) into the hafnium type insulation film forming the High-k film 23n. Incidentally, as the metallic element to be added to the hafnium type insulation film forming the High-k film 23n, lanthanum (La) was mentioned. However, other metallic elements are acceptable. Incidentally, the metallic element forming the cap film 24n may be entirely added to the High-k film 23n.

Over the top surface of the cap film 24n, there is formed a gate electrode 12 in a structure in which a titanium nitride (TiN) film 25 and a polycrystalline silicon film 26 are stacked. In place of the titanium nitride (TiN) film, another metal film may be used. The thickness of the titanium nitride (TiN) film 25 is, for example, about 5 to 20 nm. Whereas, the thickness of the polycrystalline silicon film 26 is, for example, about 30 to 80 nm. Further, over the top surface of the gate electrode 12, a silicide film 16 is formed. The silicide film 16 is, for example, a nickel silicide (NiSi) film or a platinum silicide (PtSi) film.

At each sidewall on the opposite sides of a lamination film including the gate electrode 12, the cap film 24n, and the High-k film 23n, an offset sidewall 27 and a sidewall 30 both each including, for example, an insulation film are formed sequentially from the inner side. Further, in the semiconductor substrate 1 (p type well 7) on the opposite sides of the gate electrode 12, n type semiconductor regions 28 are formed. Outside the n type semiconductor regions 28, n type semiconductor regions 31 are formed. Over the top surface of each n type semiconductor region 31, there is formed a silicide film 16 formed in the same step as that for the silicide film 16 formed over the top surface of the gate electrode 12.

Subsequently, the configuration of the pMIS will be described.

Over the main surface of the semiconductor substrate 1 in the pMIS forming region (n type well 8), a gate insulation film 10$p$ is formed. The gate insulation film 10$p$ includes a second oxide film (gate oxide film) 9 having a composition of $SiO_2$, and a High-k film 23$p$ with a higher relative dielectric constant than that of $SiO_2$. As the High-k film 23$p$, there is used a hafnium type insulation film such as a hafnium oxide ($HfO_x$) film, a hafnium oxynitride (HfON) film, a hafnium silicate ($HfSiO_x$) film, or a hafnium silicate nitride (HfSiON) film. The hafnium type insulation film contains a metallic element such as aluminum (Al) for adjusting the work function, and obtaining the desirable threshold voltage of the pMIS. Therefore, as the typical constituent material of the High-k film 23$p$, for example, hafnium aluminum oxynitride (HfAlON) may be mentioned. The thickness of the High-k film 23$p$ is, for example, about 1 nm.

Further, when the semiconductor substrate 1 and the High-k film 23$p$ are in direct contact with each other, the mobility of the pMIS may be reduced. However, by interposing the second oxide film 9 between the semiconductor substrate 1 and the High-k film 23$p$, it is possible to prevent the reduction of the mobility. The thickness of the second oxide film 9 is, for example, about 0.5 to 1.5 nm.

Over the top surface of the gate insulation film 10$p$, a cap film 24$p$ is formed. The cap film 24$p$ is, for example, an aluminum oxide (AlO) film, and is formed in order to add a metallic element for obtaining the threshold voltage of the pMIS, i.e., aluminum (Al) into the hafnium type insulation film forming the High-k film 23$p$. Incidentally, as the metallic element to be added to the hafnium type insulation film forming the High-k film 23$p$, aluminum (Al) was mentioned. However, other metallic elements are acceptable. Incidentally, the metallic element forming the cap film 24$p$ maybe entirely added to the High-k film 23$p$.

Over the top surface of the cap film 24$p$, there is formed a gate electrode 12. Over the top surface of the gate electrode 12, a silicide film 16 is formed. The gate electrode 12 and the silicide film 16 have the same configurations as those of the gate electrode 12 and the silicide film 16 of the nMIS described above, respectively.

At each sidewall on the opposite sides of a lamination film including the gate electrode 12, the cap film 24$p$, and the High-k film 23$p$, an offset sidewall 27 and a sidewall 30 both each including, for example, an insulation film are formed sequentially from the inner side. Further, in the semiconductor substrate 1 (n type well 8) on the opposite sides of the gate electrode 12, p type semiconductor regions 29 are formed. Outside the p type semiconductor regions 29, p type semiconductor regions 32 are formed. Over the top surface of each p type semiconductor region 32, there is formed a silicide film 16 formed in the same step as that for the silicide film 16 formed over the top surface of the gate electrode 12.

Incidentally, in the present embodiment, the gate electrode 12 includes a lamination film of a metal film and a polycrystalline silicon film. However, the gate electrode 12 may include only a metal film. In this case, the silicide film 16 is formed only each top surface of the n type semiconductor region 31 and the p type semiconductor regions 32, and is not formed over the top surface of each gate electrode 12.

Then, a method for manufacturing the field effect transistor shown in FIG. 1 described above in accordance with one embodiment of the present invention will be described step by step by reference to FIGS. 2 to 18. FIGS. 2 to 18 are essential part cross sectional views of the nMIS and the pMIS, and show the cross-sectional views along their respective gate length directions, and the cross-sectional views along their respective gate width directions.

Figure 2:
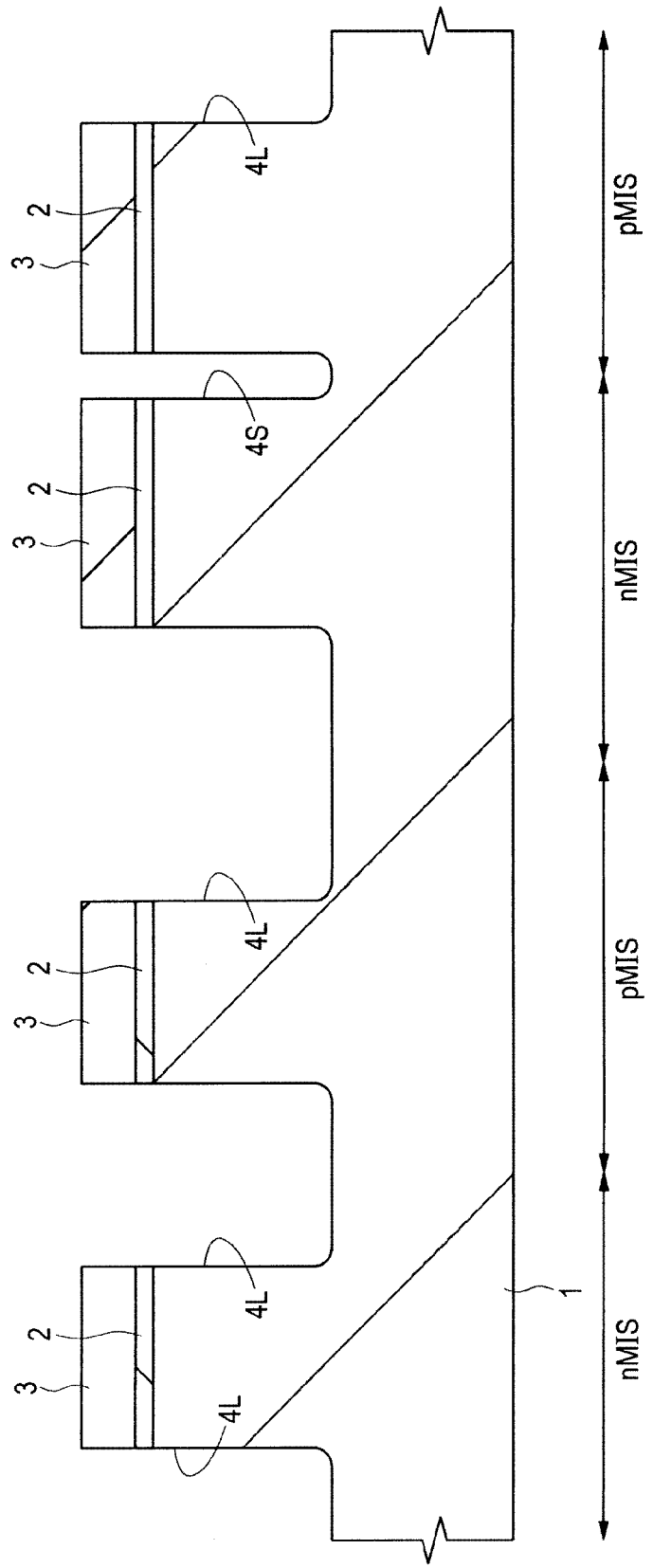
FIG. 2 is an essential part cross-sectional view along the gate length direction and the gate width direction of the field effect transistors in accordance with one embodiment of the present invention, illustrating a manufacturing step of the field effect transistors.

First, as shown in FIG. 2, there is prepared a semiconductor substrate (a thin plate of a semiconductor in a generally circular shape in plan view at this stage) 1 obtained by introducing p type impurities such as boron (B) into, for example, a single crystal silicon. Subsequently, over a main surface of the semiconductor substrate 1, a silicon oxide film (pad insulation film) 2 and a silicon nitride film (mask insulation film) 3 are sequentially formed. The thickness of the silicon oxide film 2 is, for example, about 5 to 20 nm, and the thickness of the silicon nitride film 3 is, for example, about 30 to 100 nm.

Then, using a lithography method and a dry etching method, in desirable regions of the semiconductor substrate 1, a plurality of trenches 4L and 4S having various trench widths are formed. Herein, a reference sign 4S in the drawing represents a trench having the smallest trench width, and a reference sign 4L represents a trench having a larger trench width than that. The depths of the trenches 4L and 4S are, for example, about 150 to 400 nm from the main surface of the semiconductor substrate 1. The trench width of the trench 4S having the smallest trench width is about 20 to 50 nm. Further, herein, processing is performed such that each side surface of the trenches 4L and 4S is roughly the same plane as the side surface of the silicon nitride film 3. However, processing may be performed so as to achieve the state in which each side surface of the trenches 4L and 4S protrudes from the side surface of the silicon nitride film 3, i.e., the offset-provided state.

Figure 3:
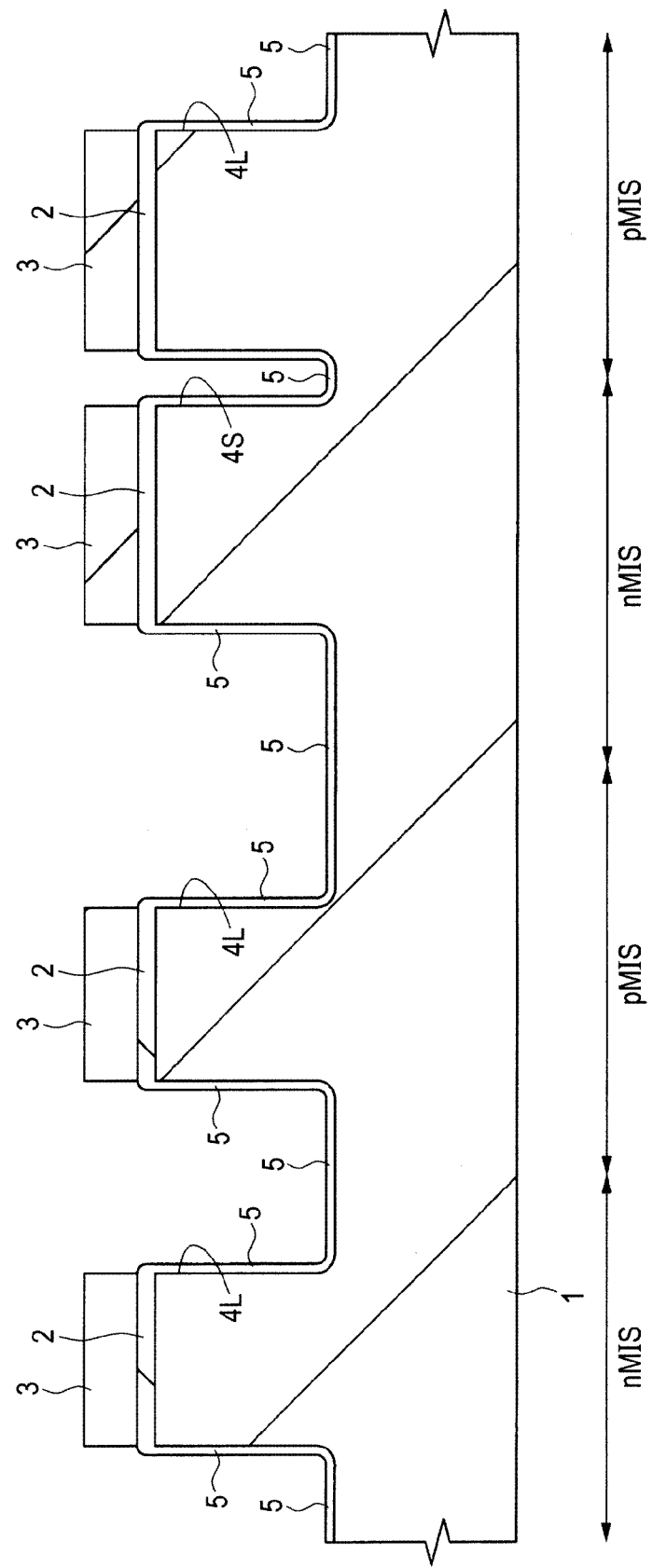
FIG. 3 is an essential part cross-sectional view of the same portion as that of FIG. 2 of each field effect transistor during a manufacturing step following that of FIG. 2.

Then, as shown in FIG. 3, the insides of the trenches 4L and 4S are washed. Then, portions of the semiconductor substrate 1 at the inner walls (side surfaces and the bottom surfaces) of the trenches 4L and 4S are oxidized by a thermal oxidation method, thereby to form each inner wall oxide film 5. The thickness of the inner wall oxide film 5 is, for example, about 3 to 10 nm. When as the thermal oxidation method, a method using active oxidized species such as a radical oxidation method is used, the side surfaces and the bottom surfaces of the trenches 4L and 4S having mutually different plane orientations can be oxidized uniformly at roughly the same oxidation speed. When the trenches 4L and 4S are formed each with an offset provided, the end of the main surface of the semiconductor substrate 1 in the active region is oxidized in a round form. Accordingly, it is possible to relieve the malfunction due to the electric field concentration upon operating the field effect transistor.

Figure 4:
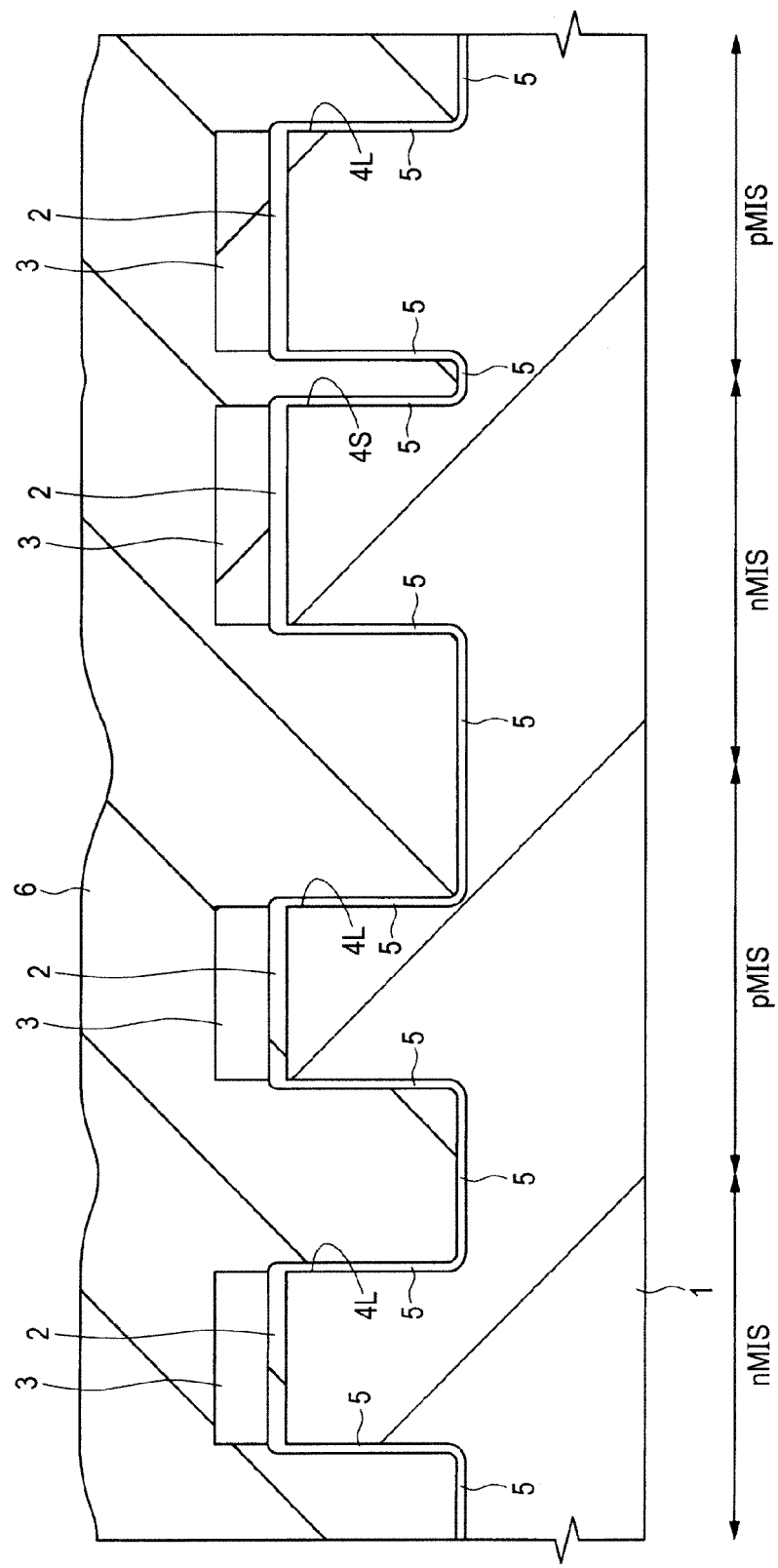
FIG. 4 is an essential part cross-sectional view of the same portion as that of FIG. 2 of the field effect transistor during a manufacturing step following that of FIG. 3.

Then, as shown in FIG. 4, over the main surface of the semiconductor substrate 1 including, for example, the insides of the trenches 4L and 4S, Polysilazane; —$(SiH_2—NH)_n$— is deposited using a coating method, followed by a heat treatment in a water vapor atmosphere. As a result, a silicon oxide film (underlying silicon oxide film) 6 is formed. The thickness of polysilazane deposited over the top surface of the silicon nitride film 3 is, for example, about 300 to 700 nm. Whereas, the temperature of the heat treatment is, for example, about 600 to 800° C. The formation method of the silicon oxide film 6 is not limited to the coating method using polysilazane, but another CVD method such as a SA-CVD method or a HDP-CVD method maybe used. Alternatively, a deposition method using Silanol type materials may be used.

The silicon oxide film 6 has a nearly stoichiometric composition ($SiO_2$).

Figure 5:
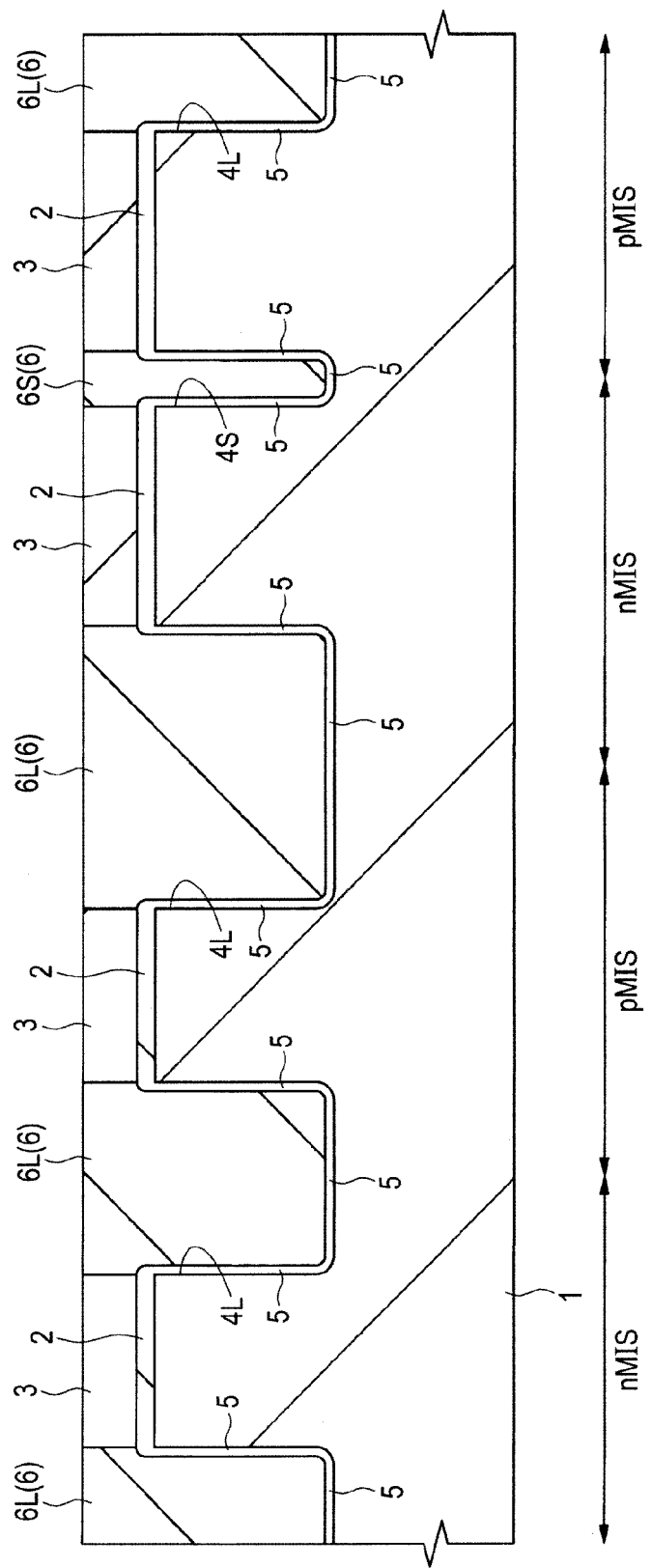
FIG. 5 is an essential part cross-sectional view of the same portion as that of FIG. 2 of the field effect transistor during a manufacturing step following that of FIG. 4.

Then, as shown in FIG. 5, using a CMP method, with the silicon nitride film 3 as a stopper film, the surface of the silicon oxide film 6 is polished. As a result, in the insides of the trenches 4L and 4S, the silicon oxide film 6 is embedded, resulting in trench type element isolation films (underlying silicon oxide films) 6L and 6S. Herein, the silicon oxide film 6 embedded in the inside of each trench 4L is the trench type element isolation film 6L. The silicon oxide film 6 embedded in the inside of each trench 4S is the trench type element isolation film 6S.

Figure 6:
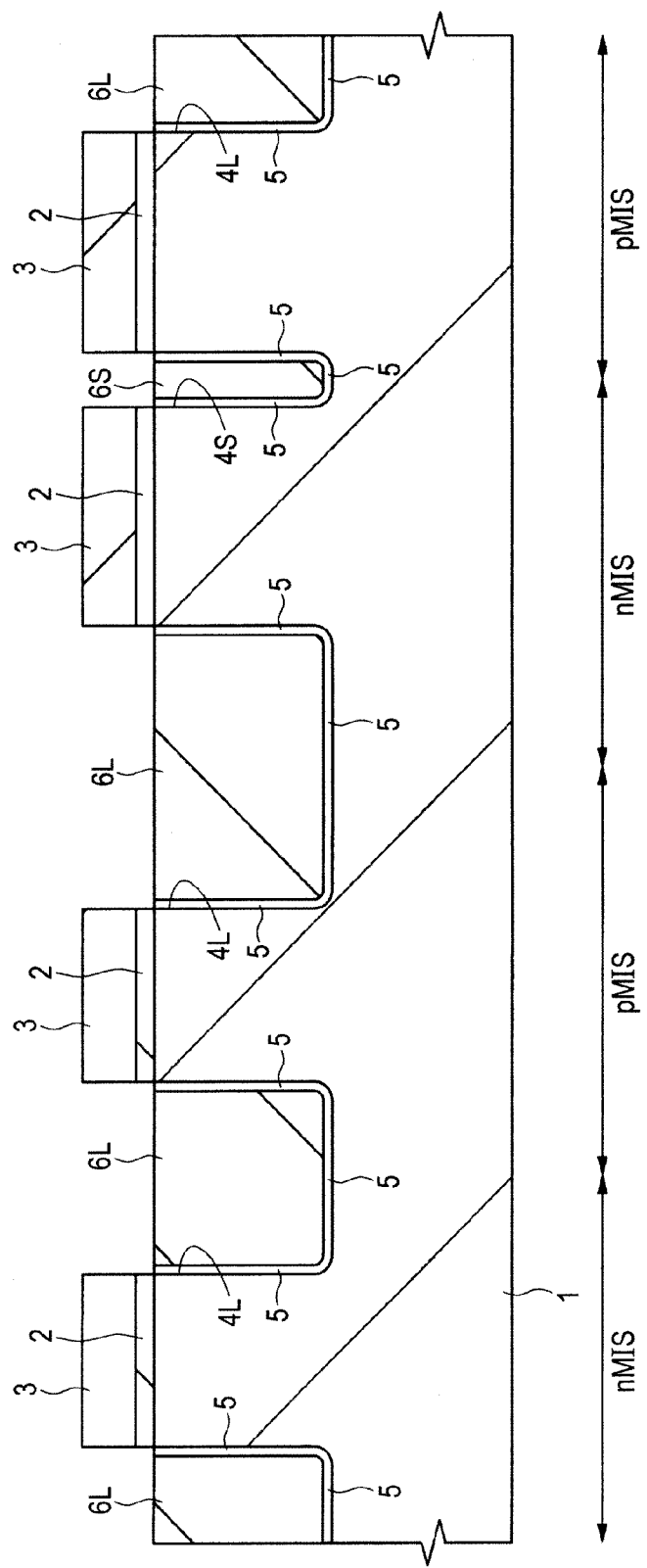
FIG. 6 is an essential part cross-sectional view of the same portion as that of FIG. 2 of the field effect transistor during a manufacturing step following that of FIG. 5.

Then, as shown in FIG. 6, using a solution containing hydrofluoric acid, the height of each top surface of the trench type element isolation films 6L and 6S from the main surface of the semiconductor substrate 1 is adjusted. Herein, there is shown the case where the position of each top surface of the trench type element isolation films 6L and 6S is set equal to the position of the main surface of the semiconductor substrate 1. However, the position of each top surface of the trench type element isolation films 6L and 6S may be set lower than the position of the main surface of the semiconductor substrate 1 by, for example, about 10 nm.

Figure 7:
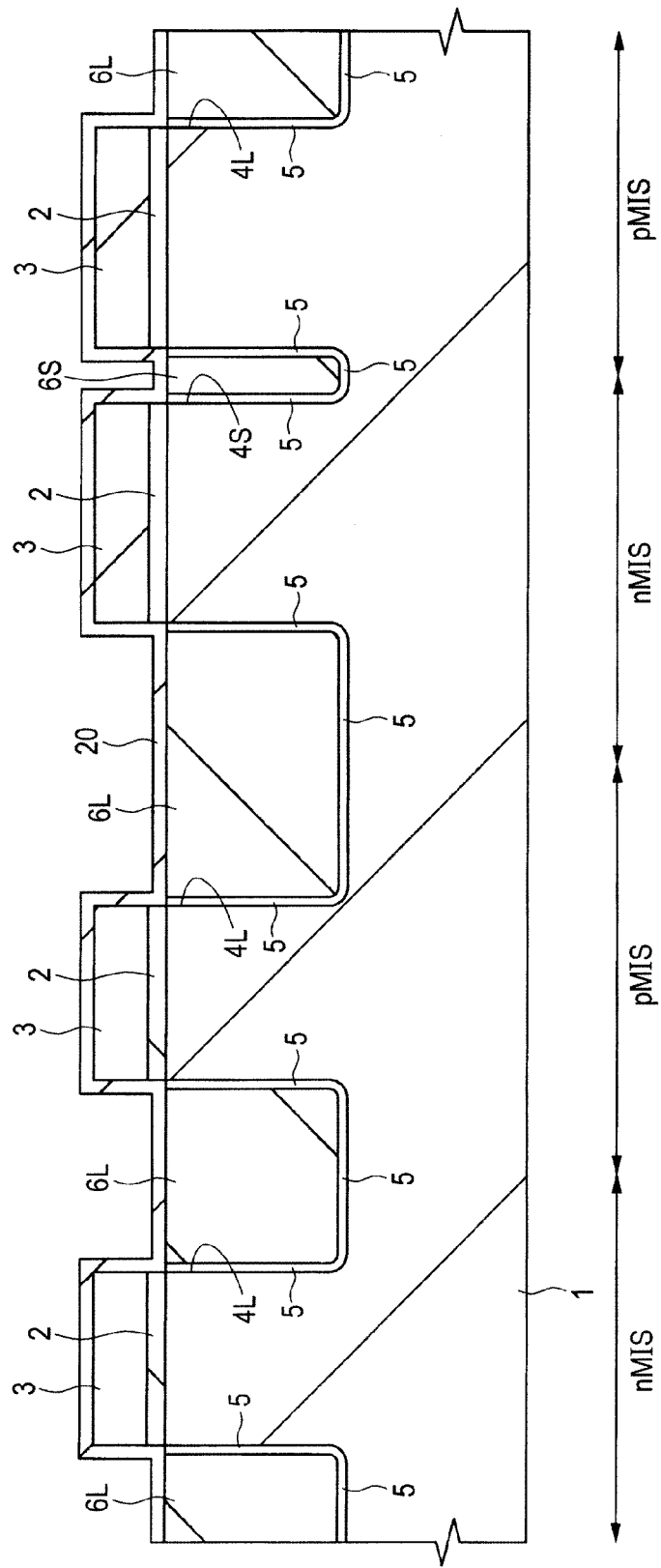
FIG. 7 is an essential part cross-sectional view of the same portion as that of FIG. 2 of the field effect transistor during a manufacturing step following that of FIG. 6.

Then, as shown in FIG. 7, over the main surface of the semiconductor substrate 1, a diffusion preventive film (silicon film or silicon-rich oxide film) 20 including a silicon film or a silicon-rich oxide film is deposited. When the thickness of the diffusion preventive film 20 is, for example, 50 nm or more, the step difference in the diffusion preventive film 20 causes processing defects such as etching residues along the step difference side surface during the subsequent gate electrode formation step. On the other hand, when the thickness of the diffusion preventive film 20 is too small, it becomes impossible to obtain the effect (effect of preventing the diffusion of the oxidized species) of the diffusion preventive film 20. Thus, the thickness of the diffusion preventive film 20 was set at, for example, about 3 to 20 nm. The preferable thickness was set at, for example, about 10 to 20 nm.

The position of the top surface of the diffusion preventive film 20 is higher than the main surface of the semiconductor substrate by the thickness thereof for the following reason. The position of each top surface of the trench type element isolation films 6L and 6S is equal to the position of the main surface of the semiconductor substrate 1. However, by setting the position of each top surface of the trench type element isolation films 6L and 6S lower than the position of the main surface of the semiconductor substrate 1, it is possible to make the position of the top surface of the diffusion preventive film 20 roughly equal to the position of the main surface of the semiconductor substrate 1.

Further, the silicon-rich oxide film is a silicon oxide film with a higher silicon ratio (a smaller oxygen ratio) than in the stoichiometric composition ($SiO_2$). The composition is expressed as a chemical formula: $SiO_x$ ($0<x<2$). Therefore, the composition of the diffusion preventive film 20 including a silicon film or a silicon-rich oxide film is $SiO_x$ ($0 \le X<2$). The ratio of silicon to oxygen in the diffusion preventive film 20 is larger than the ratio of silicon to oxygen in the silicon oxide film 6 described above. The silicon film or the silicon-rich oxide film is formed by, for example, a HDP-CVD method, and can be adjusted in composition by adjusting the partial pressure or the flow rate ratio of a silane ($SiH_4$) gas and an oxygen ($O_2$) gas, or the like.

Figure 8:
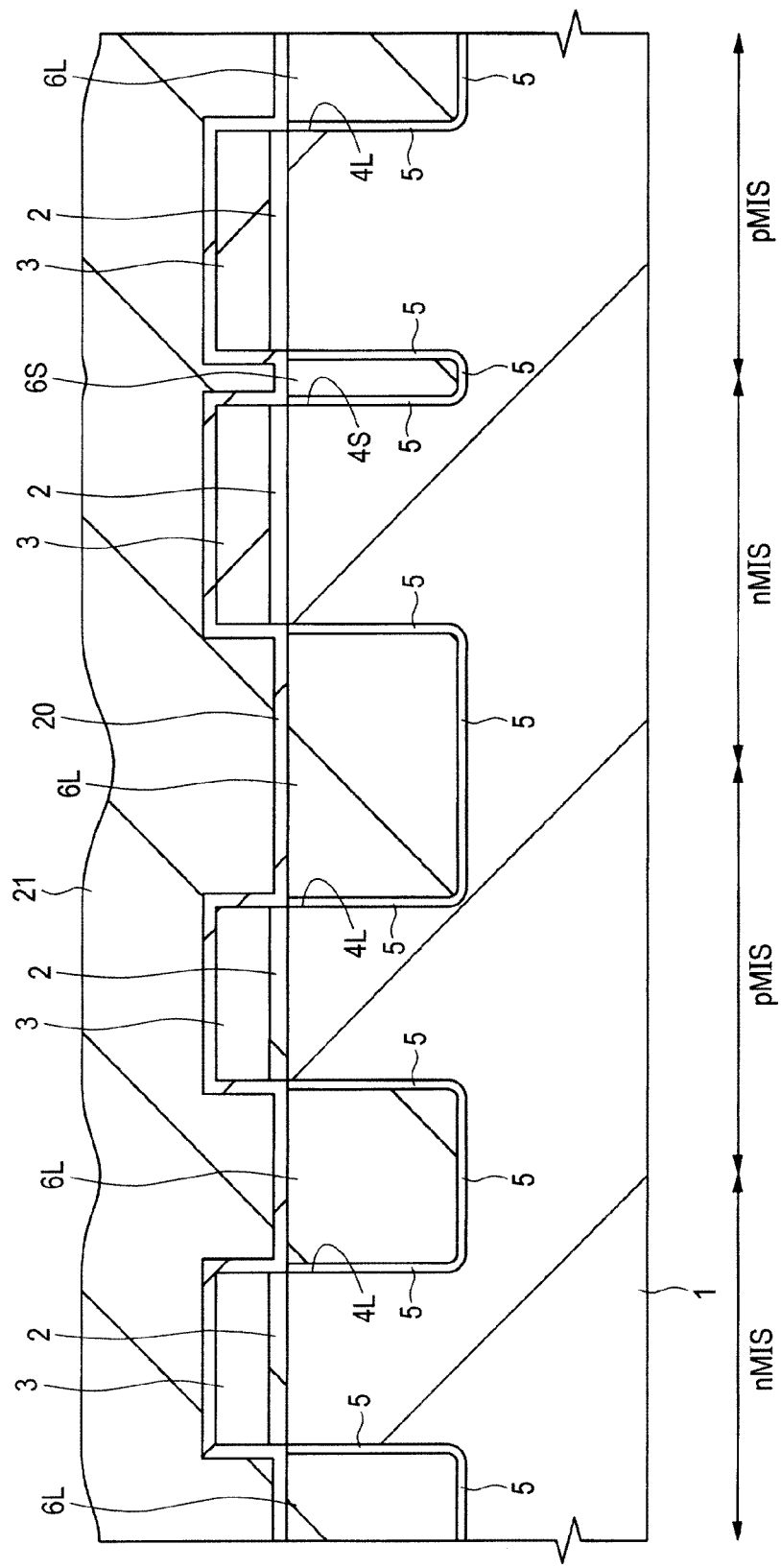
FIG. 8 is an essential part cross-sectional view of the same portion as that of FIG. 2 of the field effect transistor during a manufacturing step following that of FIG. 7.

Then, as shown in FIG. 8, using a HDP-CVD method, over the main surface of the semiconductor substrate 1 (over the diffusion preventive film 20), a silicon oxide film (overlying silicon oxide film) 21 is deposited. The thickness of the silicon oxide film 21 deposited over the top surface of the silicon nitride film 3 via the diffusion preventive film 20 is, for example, about 150 to 500 nm. After the deposition of the silicon oxide film 21, a heat treatment may be performed at a temperature of, for example, 1100° C. for about 60 seconds, thereby to stabilize the film quality of the silicon oxide film 21. Further, herein, using the HDP-CVD method, the silicon oxide film 21 was formed. However, the silicon oxide film 21 can be formed by other deposition methods, for example, the same deposition method as that of the silicon oxide film 6 described above. Namely, there may be used a coating method, a SA-CVD method, or a deposition method using a silanol type material.

Figure 9:
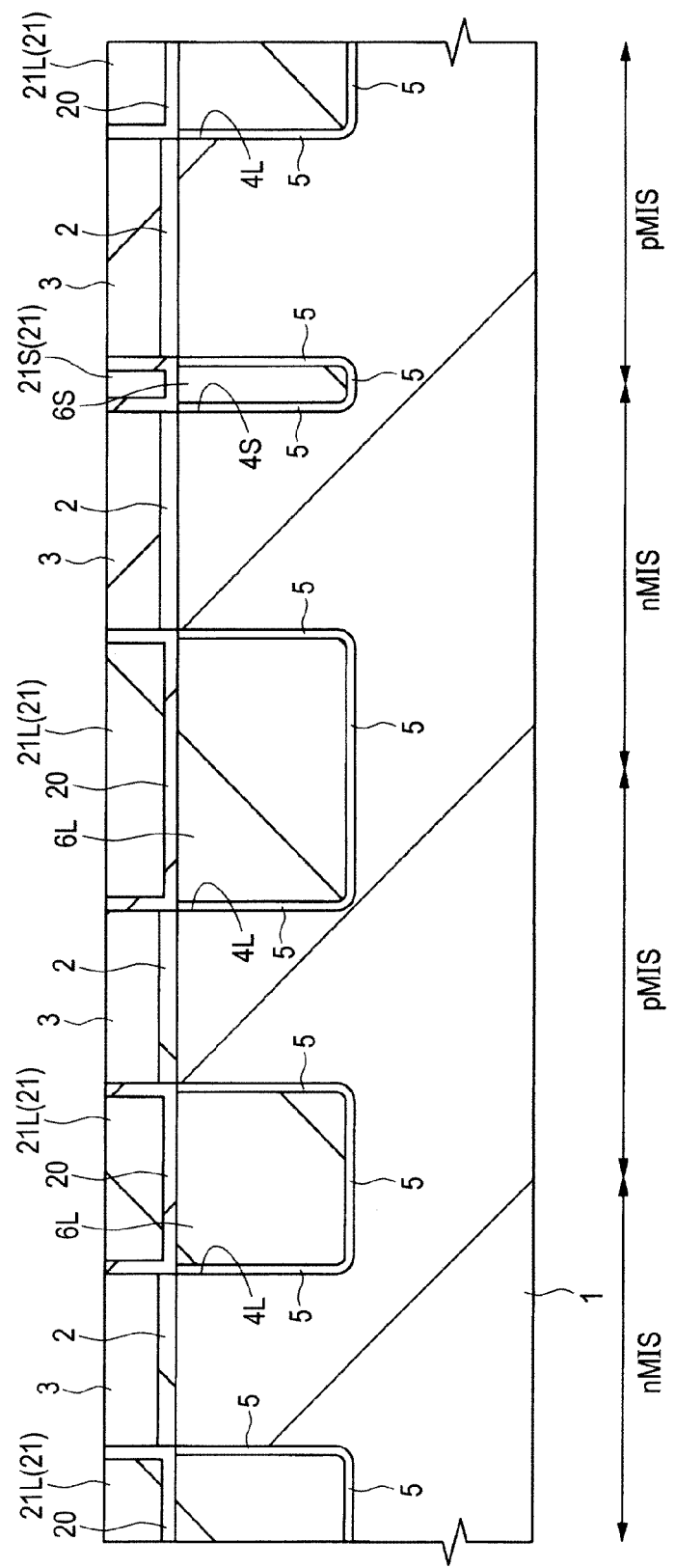
FIG. 9 is an essential part cross-sectional view of the same portion as that of FIG. 2 of the field effect transistor during a manufacturing step following that of FIG. 8.

Then, as shown in FIG. 9, using a CMP method, with the silicon nitride film 3 as a stopper film, the surface of the silicon oxide film 21 is polished. As a result, in only regions over the top surfaces of the trench type element isolation films 6L and 6S, and surrounded by the silicon nitride film 3, the silicon oxide films 21L and 21S are embedded via the diffusion preventive film 20, respectively. At this step, portions of the diffusion preventive film 20 formed over the top surface of each silicon nitride film 3 are removed. However, portions of the diffusion preventive film 20 are left between the silicon oxide films 21L and 21S embedded in regions surrounded by the silicon nitride films 3 and the silicon nitride films 3. Therefore, the side surfaces and the bottom surfaces of the silicon oxide films 21L and 21S each embedded in the region over each top surface of the trench type element isolation films 6L and 6S and surrounded by the silicon nitride films 3 are in contact with the diffusion preventive film 20. Herein, each silicon oxide film 21 formed over the top surface of the trench type element isolation film 6L via the diffusion preventive film 20 is the silicon oxide film 21L. Each silicon oxide film 21 formed over the top surface of the trench type element isolation film 6S via the diffusion preventive film 20 is the silicon oxide film 21S.

Figure 10:
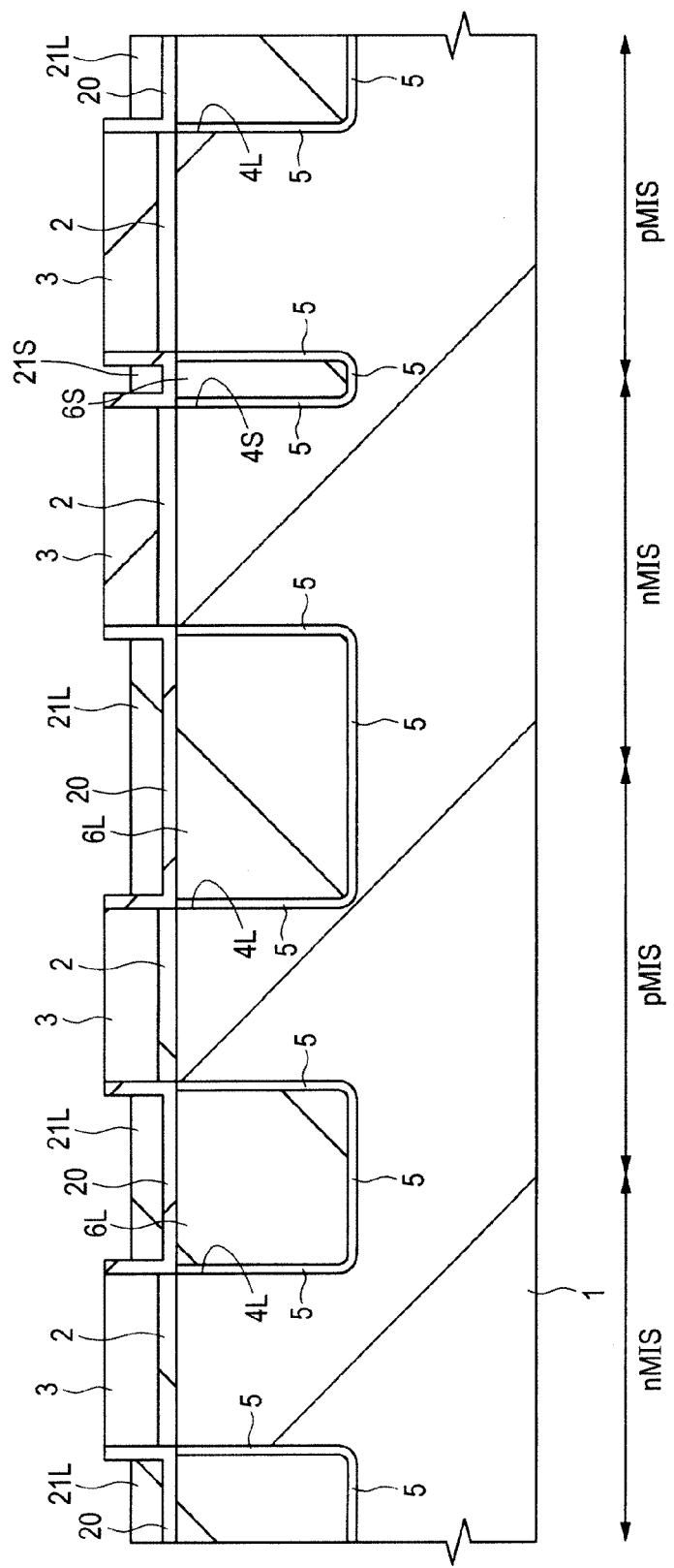
FIG. 10 is an essential part cross-sectional view of the same portion as that of FIG. 2 of the field effect transistor during a manufacturing step following that of FIG. 9.

Then, as shown in FIG. 10, using a solution containing hydrofluoric acid, each thickness of the silicon oxide films 21L and 21S embedded in their respective regions over the top surfaces of the trench type element isolation films 6L and 6S and surrounded by the silicon nitride films 3 is adjusted. Each thickness (first thickness) of the silicon oxide films 21L and 21S was set at, for example, about 31.5 to 33 nm.

Herein, when each thickness of the silicon oxide films 21L and 21S is too large, the silicon oxide films 21L and 21S become sources for oxidized species. Accordingly, the threshold voltage of each field effect transistor may vary. Further, when each thickness of the silicon oxide films 21L and 21S is 5 nm or more in a later step of forming the gate electrode 12, each step difference in the silicon oxide films 21L and 21S causes processing defects such as etching residues along the step difference side surface. On the other hand, when the silicon oxide films 21L and 21S are entirely removed, the underlying diffusion preventive films 20 are oxidized in the subsequent step. As a result, it becomes impossible to obtain the effect (effect of preventing the diffusion of the oxidized species) of each diffusion preventive film 20. Thus, in a later step of forming the gate insulation films 10n and 10p, each thickness (first thickness) of the silicon oxide films 21L and 21S is adjusted so that each thickness (fourth thickness) of the silicon oxide films 21L and 21S is about 0.5 to 2 nm.

Figure 11:
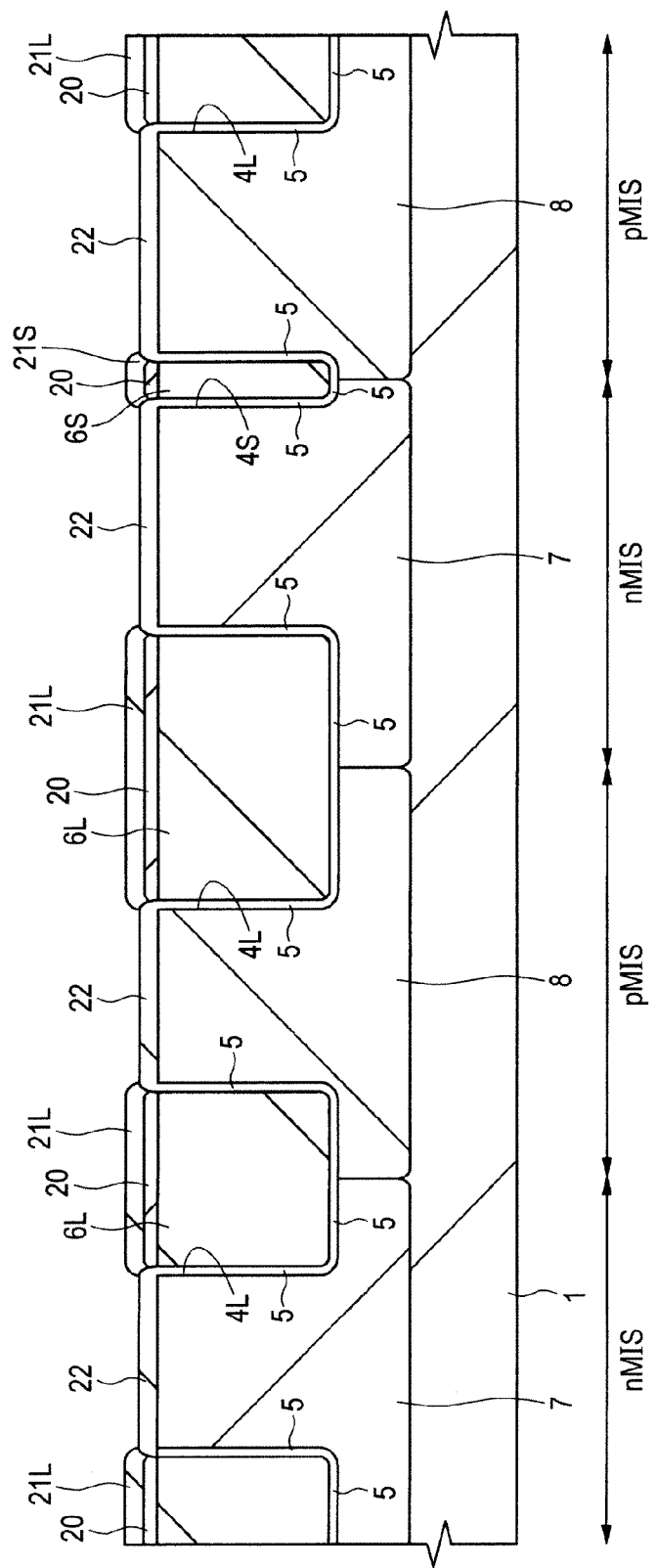
FIG. 11 is an essential part cross-sectional view of the same portion as that of FIG. 2 of the field effect transistor during a manufacturing step following that of FIG. 10.

Then, as shown in FIG. 11, using hot phosphoric acid, the silicon nitride films 3 are removed. Subsequently, using a solution containing hydrofluoric acid, the silicon oxide films 2, and the portions of the diffusion preventive films 20 at the side surfaces of the silicon oxide films 21L and 21S are removed. This exposes portions of the main surface of the semiconductor substrate 1 in which the trenches 4L and 4S are not formed. Herein, the silicon oxide films 21L and 21S are also wet etched by about 20 nm with a solution containing hydrofluoric acid. As a result, each thickness (second thickness) of the silicon oxide films 21L and 21S is, for example, about 11.5 to 13 nm.

Subsequently, using a thermal oxidation method, over each portion of the main surface of the semiconductor substrate 1 in which the trenches 4L and 4S are not formed, a silicon oxide film 22 is formed. The thickness of the silicon oxide film 22 is, for example, about 5 nm.

As a result, over only each top surface of the trench type element isolation films 6L and 6S embedded in the trenches 4L and 4S, respectively, the diffusion preventive film 20 is formed. Further, over the top surfaces of the diffusion preventive films 20, there are formed silicon oxide films 21L and 21S, respectively.

Then, into the semiconductor substrate 1 in the nMIS forming region, using an ion implantation method, p type impurities (e.g., boron (B)) are selectively introduced, thereby to form a p type well 7. At this step, the silicon oxide film 22 is used as a screen film. Similarly, into the semiconductor substrate 1 in the pMIS forming region, using an ion implantation method, n type impurities (e.g., phosphorus (P) or arsenic (As)) are selectively introduced, thereby to form an n type well 8. At this step, the silicon oxide film 22 is used as a screen film. Subsequently, impurities for adjusting respective threshold voltages of the nMIS and the pMIS are introduced into the semiconductor substrate 1 using an ion implantation method.

Then, by a wet etching method using a solution containing hydrofluoric acid, the silicon oxide film 22 is removed. Herein, the silicon oxide films 21L and 21S are also wet etched by about 5 nm with a solution containing hydrofluoric acid. Accordingly, each thickness (third thickness) of the silicon oxide films 21L and 21S is, for example, about 6.5 to 8 nm.

Then, at the main surface of the semiconductor substrate 1, using, for example, a thermal oxidation method, a first oxide film (not shown) is formed. The thickness of the first oxide film is, for example, about 2 to 6 nm. The first oxide film is used for each gate insulation film of an nMIS and a pMIS formed in, for example, an input/output circuit or a power circuit, and required to have a breakdown voltage as high as, for example, about 2.5 V. Then, using a lithography method and a wet etching method using a solution containing hydrofluoric acid, portions of the first oxide film are left only in desired regions, and portions of the first oxide film in other regions are removed. Herein, in the regions from each of which the first oxide film has been removed, the silicon oxide films 21L and 21S are also wet etched by about 6 nm with a solution containing hydrofluoric acid. Accordingly, each thickness (fourth thickness) of the silicon oxide films 21L and 21S is, for example, about 0.5 to 2 nm. Incidentally, the nMISs and the pMISs described in the present embodiment are formed in the regions from each of which the first oxide film has been removed.

Figure 12:
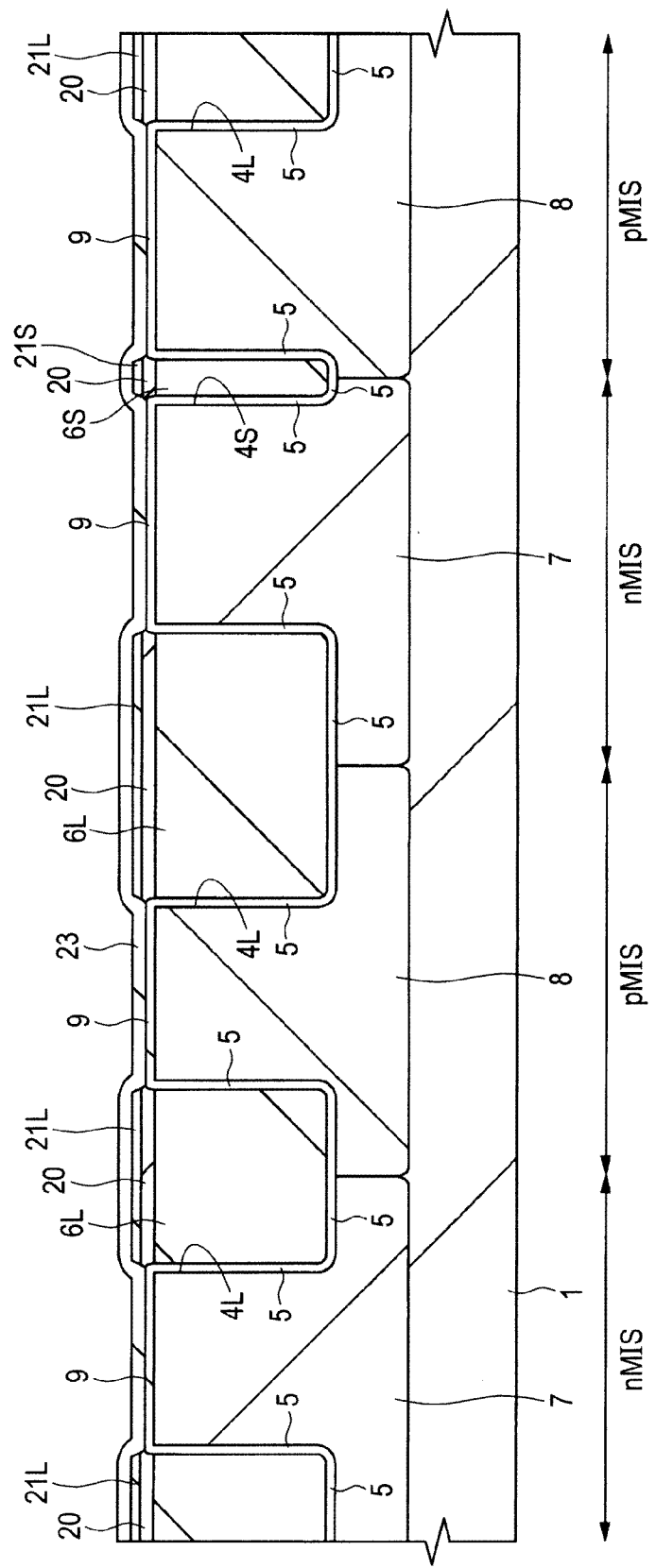
FIG. 12 is an essential part cross-sectional view of the same portion as that of FIG. 2 of the field effect transistor during a manufacturing step following that of FIG. 11.

Then, as shown in FIG. 12, over the main surface of the semiconductor substrate 1 in each region from which the first oxide film has been removed, using, for example, a thermal oxidation method, the second oxide film (gate oxide film) 9 is formed. The thickness of the second oxide film 9 is, for example, about 0.5 to 1.5 nm. As a result, in regions for forming the nMISs and the pMISs to be formed in, for example, an input/output circuit or a power circuit, and to be required to have a breakdown voltage as high as about 2.5 V, the first oxide film with a thickness of about 2 to 6 nm is formed. In regions for forming the nMISs and pMISs to be formed in, for example, a memory circuit or a processor circuit, and to be required to have a breakdown voltage as low as about 1.0 V, there is formed the second oxide film 9 with a thickness of about 0.5 to 1.5 nm.

As described above, during the time from removal of the silicon nitride film 3 using hot phosphoric acid until formation of the second oxide film 9, there are performed three thermal oxidations and two wet etchings (deposition of the silicon oxide film 22 by a thermal oxidation method and removal of the film by wet etching, deposition of the first oxide film by a thermal oxidation method and removal of the film by wet etching, and deposition the second oxide film 9 by a thermal oxidation method).

However, the top surfaces of the trench type element isolation films 6L and 6S embedded in their respective insides of the trenches 4L and 4S are covered with the diffusion preventive films 20 each including a silicon film or a silicon-rich film. For this reason, the top surfaces of the trench type element isolation films 6L and 6S are less likely to be wet etched. This can prevent the occurrence of divots in the ends of the top surfaces of the trench type element isolation films 6L and 6S (the portions of the top surfaces of the trench element isolation film 6L and 6S along their respective inner walls of the trenches 4L and 4S).

Further, the top surfaces of the trench type element isolation films 6L and 6S embedded in their respective insides of the trenches 4L and 4S are covered with the diffusion preventive films 20 each including a silicon film or a silicon-rich film. For this reason, even when the thermal oxidation method is repeatedly performed, oxidized species such as oxidized molecules or water molecules are captured by the diffusion preventive films 20, and become less likely to intrude into the trench type element isolation films 6L and 6S. Further, the oxidized species contained in the trench type element isolation films 6L and 6S also become less likely to be released.

Herein, over the main surface of the semiconductor substrate 1, the first oxide film with a thickness of about 2 to 6 nm, and the second oxide film 9 with a thickness of about 0.5 to 1.5 nm are formed. As a result, two types of oxide films with mutually different thicknesses are formed. However, in order to enhance the functions of the LSI, three or more types of oxide films with mutually different thicknesses may be formed. A lithography method and a wet etching method are repeated in the foregoing procedure, thereby to form three or more types of oxide films with mutually different thicknesses. As a result, it is possible to form three or more types of oxide films with mutually different thicknesses. Even when the three or more types of oxide films with mutually different thicknesses are formed, the formation of the diffusion preventive film 20 can prevent the occurrence of divots in the ends of the top surfaces of the trench type element isolation films 6L and 6S (the portions of the top surfaces of the trench element isolation film 6L and 6S along their respective inner walls of the trenches 4L and 4S). Further, it is possible to prevent diffusion of oxidized species into the trench type element isolation films 6L and 6S embedded in their respective insides of the trenches 4L and 4S, or release of oxidized species from the trench type element isolation films 6L and 6S embedded in their respective insides of the trenches 4L and 4S.

Figure 13:
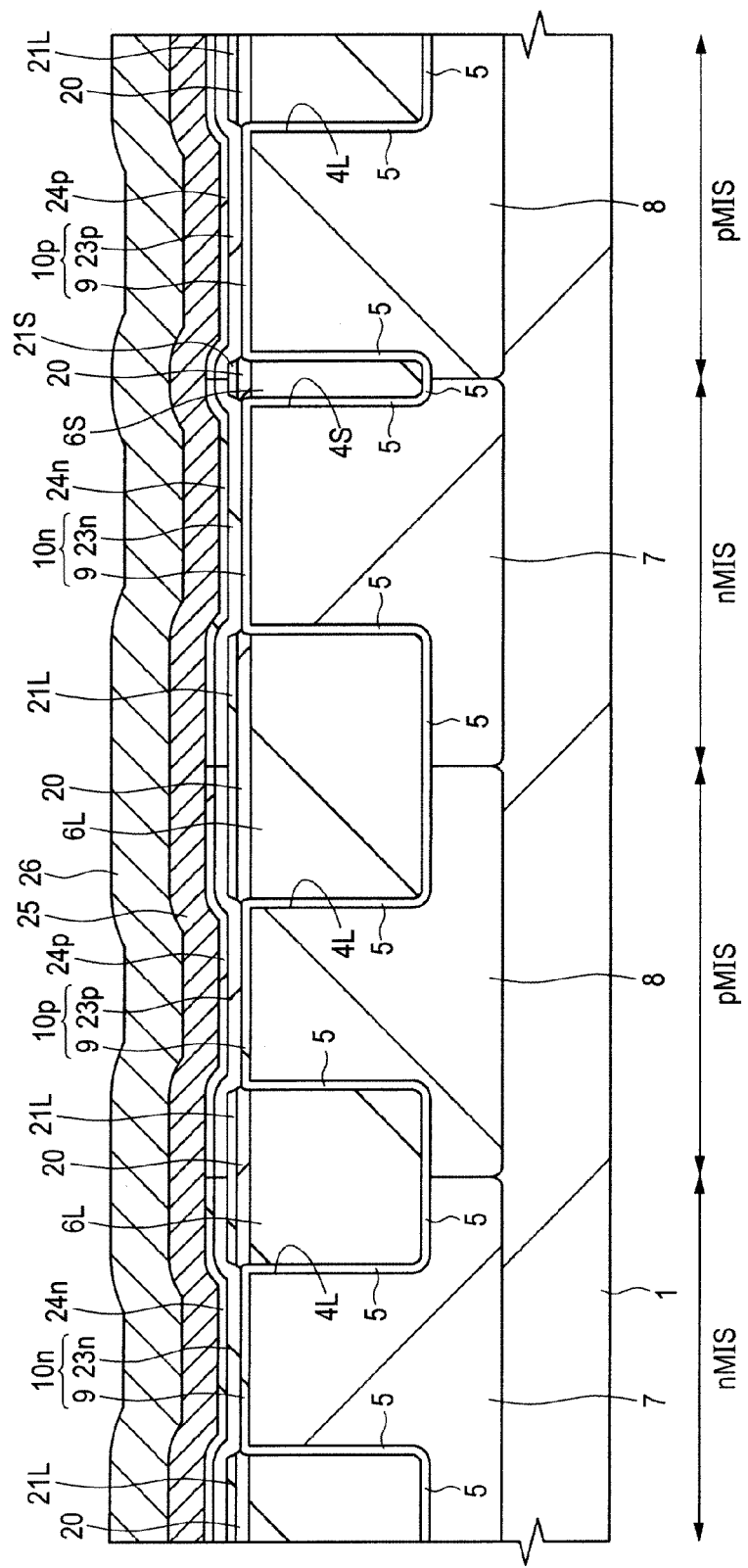
FIG. 13 is an essential part cross-sectional view of the same portion as that of FIG. 2 of the field effect transistor during a manufacturing step following that of FIG. 12.

Then, as shown in FIG. 13, over the main surface of the semiconductor substrate 1, High-k films (high dielectric constant films with a higher relative dielectric constant than that of $SiO_2$) 23n and 23p, and cap films 24n and 24p are sequentially formed. In each nMIS forming region, for the High-k film 23n, there is used a hafnium type insulation film such as a hafnium oxide ($HfO_x$) film, a hafnium oxynitride (HfON) film, a hafnium silicate ($HfSiO_x$) film, or a hafnium silicate nitride (HfSiON) film. For the cap film 24n, for example, a lanthanum oxide (LaO) film is used. In each pMIS forming region, for the High-k film 23p, there is used a hafnium type insulation film such as a hafnium oxide ($HfO_x$) film, a hafnium oxynitride (HfON) film, a hafnium silicate (HfSiOx) film, or a hafnium silicate nitride (HfSiON) film. For the cap film 24p, for example, an aluminum oxide (AlO) film is used. The High-k films 23n and 23p are formed using, for example, a CVD method or an ALD (Atomic Layer Deposition) method. Each thickness thereof is, for example, about 1 nm. Whereas, the cap films 24n and 24p are formed using, for example, a sputtering method. Each thickness thereof is, for example, about 0.1 to 1.5 nm.

Subsequently, a heat treatment is performed. The heat treatment is performed, for example, at 1000° C. for about 10 seconds. By the heat treatment, for example, lanthanum (La) is diffused from the cap film 24n into the High-k film 23n, and for example, aluminum (Al) is diffused from the cap film 24p into the High-k film 23p. As a result, in the nMIS forming region, the gate insulation film 10n including the second oxide film 9 and the High-k film 23n is formed. In the pMIS forming region, the gate insulation film 10p including the second oxide film 9 and the High-k film 23p is formed.

Then, over the main surface of the semiconductor substrate 1, for example, the titanium nitride (TiN) film 25 and the polycrystalline silicon film 26 are sequentially formed. The titanium nitride (TiN) film 25 is formed using, for example, a sputtering method. The thickness thereof is, for example, about 5 to 20 nm. The polycrystalline silicon film 26 is formed using, for example, a CVD method. The thickness thereof is, for example, about 30 to 80 nm.

Figure 14:
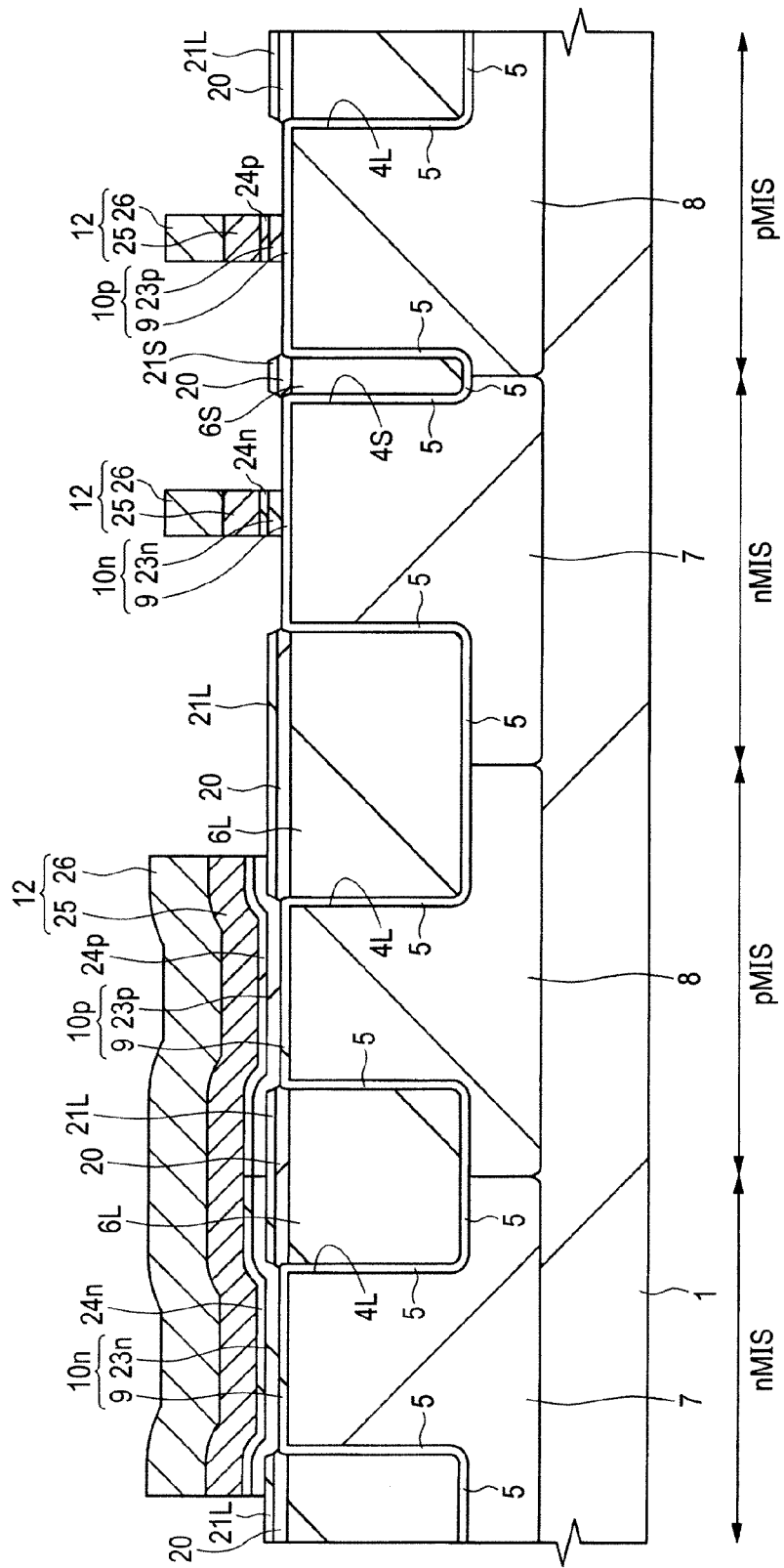
FIG. 14 is an essential part cross-sectional view of the same portion as that of FIG. 2 of the field effect transistor during a manufacturing step following that of FIG. 13.

Then, as shown in FIG. 14, using a lithography method and a dry etching method, the polycrystalline silicon film 26, the titanium nitride (TiN) film 25, the cap films 24n and 24p, and the High-k films 23n and 23p are processed.

As a result, in each nMIS forming region, there is formed a gate in a stacked gate structure for nMIS including the gate insulation film 10n including a lamination film of the second oxide film 9 and the High-k film 23n, the cap film 24n, and the gate electrode 12 including a lamination film of the titanium nitride (TiN) film 25 and the polycrystalline silicon film 26. Whereas, similarly, in each pMIS forming region, there is formed a gate in a stacked gate structure for pMIS including the gate insulation film 10p including a lamination film of the second oxide film 9 and the High-k film 23p, the cap film 24p, and the gate electrode 12 including a lamination film of the titanium nitride (TiN) film 25 and the polycrystalline silicon film 26.

Herein, the top surfaces of the trench type element isolation films 6L and 6S embedded in their respective insides of the trenches 4L and 4S, the diffusion preventive films 20 (with a thickness of about 10 to 20 nm) and the silicon oxide films 21L and 21S (with a thickness of about 0.5 to 2 nm) are formed. Accordingly, at each boundary between the trench type element isolation films 6L and 6S and the semiconductor substrate 1, there is caused a step difference equivalent to roughly the thickness thereof. However, the step difference is about 20 nm at maximum. Therefore, in dry etching for forming the gates in a stacked gate structure for nMIS and in a stacked gate structure for pMIS, processing defects such as etching residues along the step difference side surface are less likely to occur.

Further, in the ends of the top surfaces of the trench type element isolation films 6L and 6S embedded in their respective insides of the trenches 4L and 4S (the portions of the top surfaces of the trench element isolation film 6L and 6S along the inner walls of the trenches 4L and 4S), divots are not formed. For this reason, the end of the main surface of the semiconductor substrate 1 in the active region is not surrounded by the gate insulation films 10n and 10p and the gate electrodes 12. As a result, the following problem can be avoided: when the field effect transistor operates, an electric field from the gate electrode 12 strongly acts on the end of the main surface of the semiconductor substrate 1 in the active region; accordingly, an inversion layer becomes more likely to be formed, resulting in reduction of the threshold voltage of the field effect transistor.

Incidentally, also in the nMIS forming region required to have a breakdown voltage as high as about 2.5 V, there is formed a gate in a stacked gate structure for nMIS including the gate insulation film 10n including a lamination film of the first oxide film and the High-k film 23n, the cap film 24n, and the gate electrode 12 including a lamination film of the titanium nitride (TiN) film 25 and the polycrystalline silicon film 26. Whereas, similarly, also in the pMIS forming region required to have a breakdown voltage as high as about 2.5 V, there is formed a gate in a stacked gate structure for pMIS including the gate insulation film 10p including a lamination film of the first oxide film and the High-k film 23p, the cap film 24p, and the gate electrode 12 including a lamination film of the titanium nitride (TiN) film 25 and the polycrystalline silicon film 26.

Figure 15:
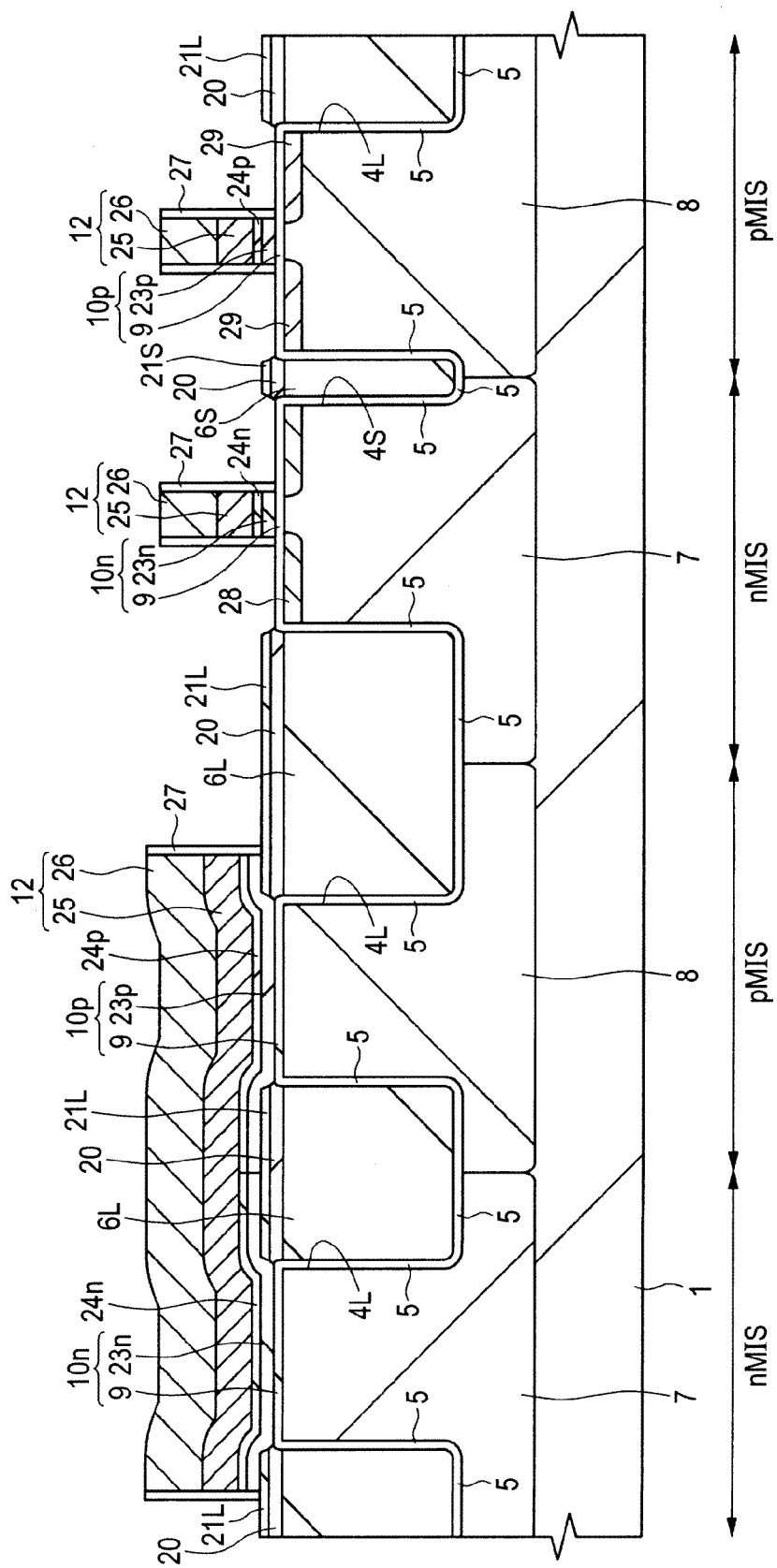
FIG. 15 is an essential part cross-sectional view of the same portion as that of FIG. 2 of the field effect transistor during a manufacturing step following that of FIG. 14.

Then, as shown in FIG. 15, at the sidewalls of the gate in a stacked gate structure for nMIS and the gate in a stacked gate structure for pMIS, there are formed the offset sidewalls each including, for example a silicon nitride film, respectively. The thickness of the offset sidewall 27 is, for example, about 5 nm.

Then, into the nMIS forming region, using an ion implantation method, n type impurities (e.g., phosphorus (P) or arsenic (As)) are introduced. As a result, n type semiconductor regions 28 are formed in self-alignment with the gate in a stacked gate structure for nMIS. Similarly, into the pMIS forming region, using an ion implantation method, p type impurities (e.g., boron (B) or boron fluoride ($BF_2$)) are introduced. As a result, p type semiconductor regions 29 are formed in self-alignment with the gate in a stacked gate structure for pMIS.

Figure 16:
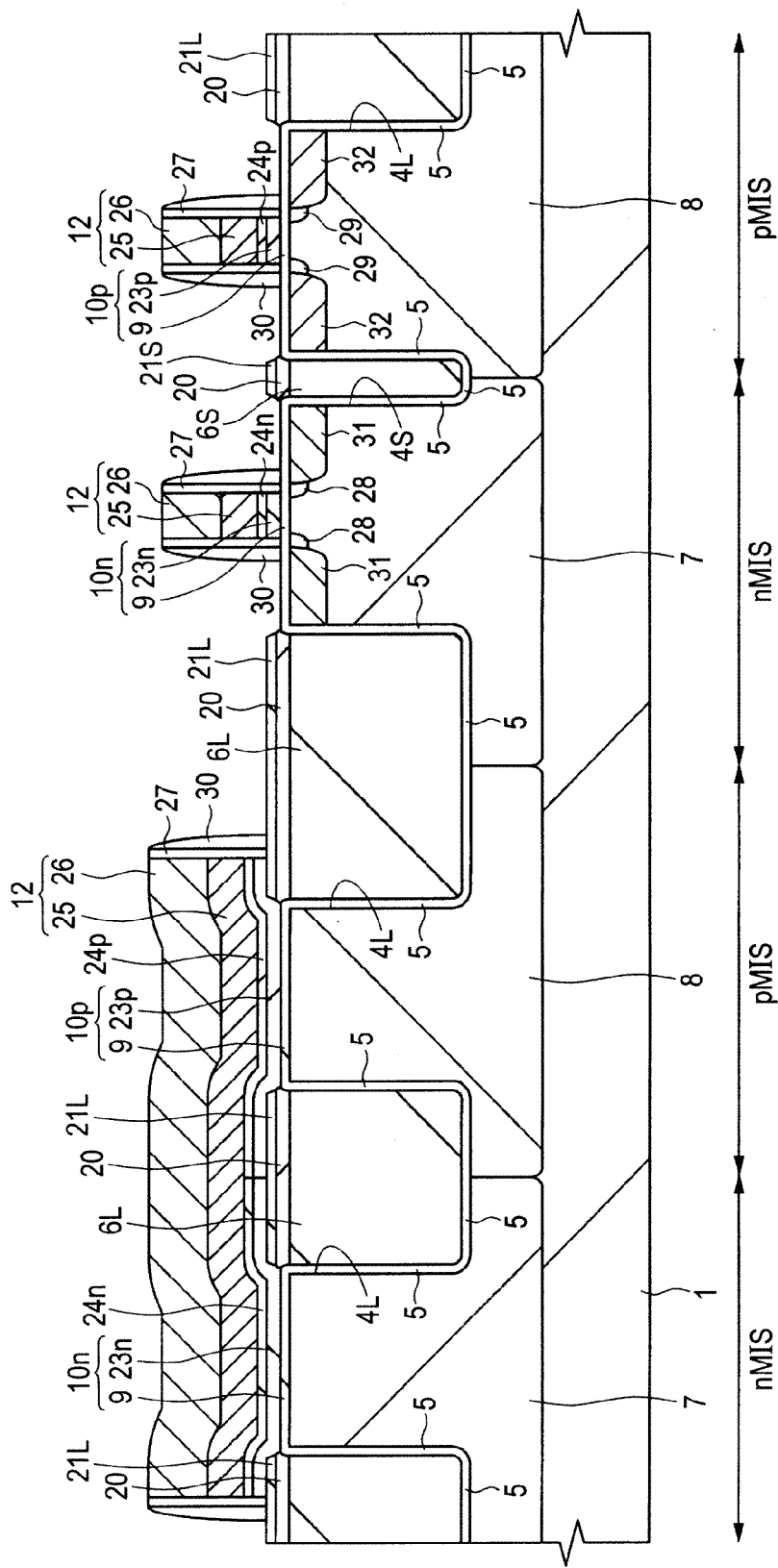
FIG. 16 is an essential part cross-sectional view of the same portion as that of FIG. 2 of the field effect transistor during a manufacturing step following that of FIG. 15.

Then, as shown in FIG. 16, over the sidewalls of the gate in a stacked gate structure for nMIS and the gate in a stacked gate structure for pMIS, there are formed the sidewalls 30 each including a lamination film of, for example, a silicon nitride film and a silicon oxide film via the offset sidewalls 27, respectively.

Then, in the nMIS forming region, using an ion implantation method, n type impurities (e.g., phosphorus (P) or arsenic (As)) are introduced. As a result, n type semiconductor regions 31 are formed in self-alignment with the gate in a stacked gate structure for nMIS and the sidewalls 30. Similarly, into the pMIS forming region, using an ion implantation method, p type impurities (e.g., boron (B) or boron fluoride ($BF_2$)) are introduced. As a result, p type semiconductor regions 32 are formed in self-alignment with the gate in a stacked gate structure for pMIS and the sidewalls 30.

Subsequently, a heat treatment is performed. The heat treatment is carried out, for example, at 1000° C. for 10 seconds, and at 1230° C. for several microseconds. By the heat treatment, the n type impurities introduced into the n type semiconductor regions 28 and 31 in the nMIS forming region are activated, and the p type impurities introduced into the p type semiconductor regions 29 and 32 in the pMIS forming region are activated. As a result, sources/drains are formed.

Figure 17:
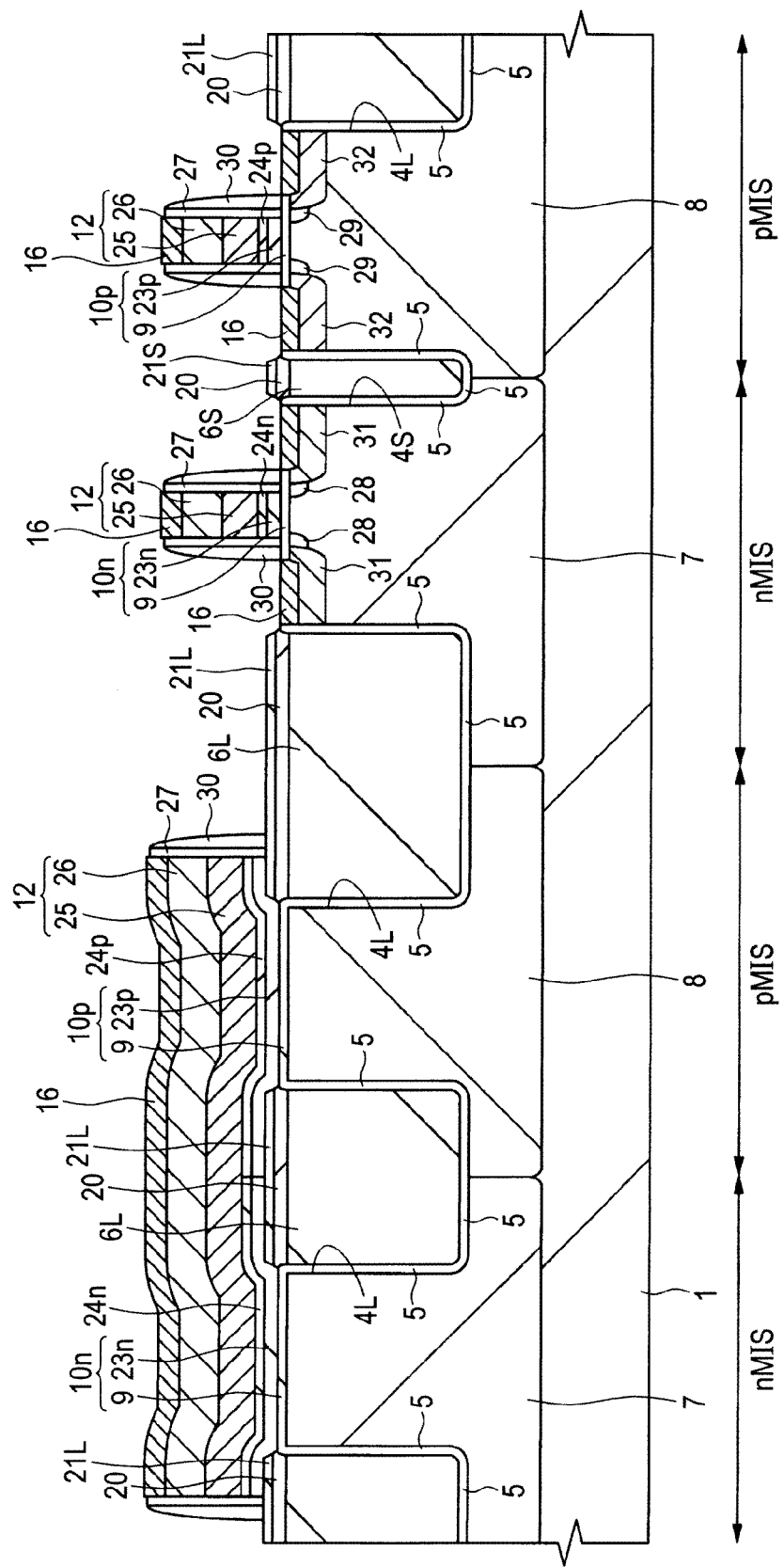
FIG. 17 is an essential part cross-sectional view of the same portion as that of FIG. 2 of the field effect transistor during a manufacturing step following that of FIG. 16.

Then, as shown in FIG. 17, over the main surface of the semiconductor substrate 1, a nickel (Ni) film is formed. Then, a heat treatment is performed. The heat treatment is carried out, for example, at 450° C. The heat treatment effects solid phase reactions between the single crystal silicon (Si) forming the semiconductor substrate 1 and nickel (Ni), and between the silicon (Si) forming the polycrystalline silicon film 26 and nickel (Ni), thereby to form nickel silicide (NiSi). Subsequently, unreacted nickel (Ni) is removed. As a result, silicide films 16 are formed over the top surfaces of the n type semiconductor regions 31 and the p type semiconductor regions 32, and the top surface of the polycrystalline silicon film 26 forming the gate electrode 12. In place of nickel silicide (NiSi), for example, platinum silicide (PtSi) can be used.

Figure 18:
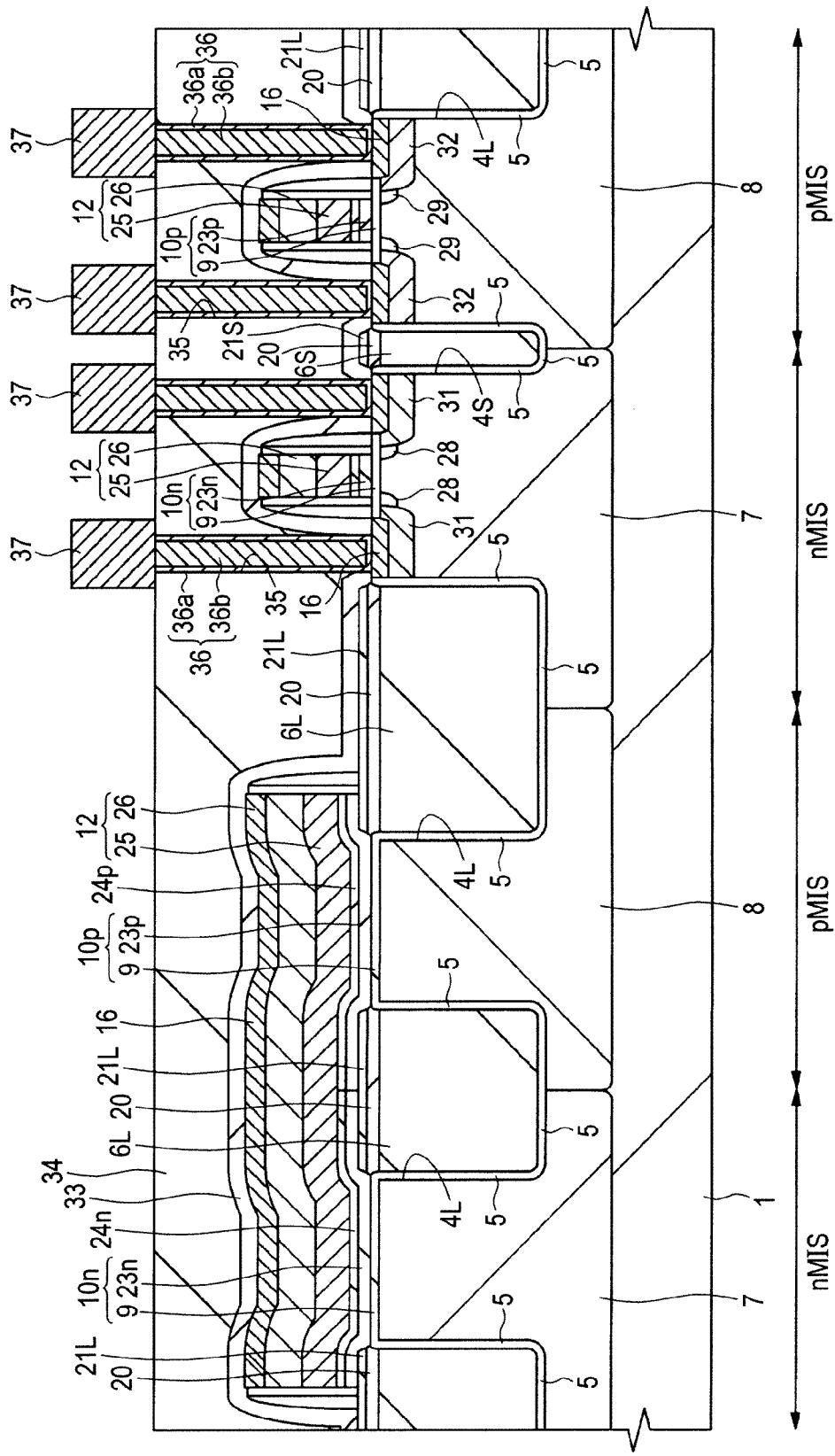
FIG. 18 is an essential part cross-sectional view of the same portion as that of FIG. 2 of the field effect transistor during a manufacturing step following that of FIG. 17.

Then, as shown in FIG. 18, over the main surface of the semiconductor substrate 1, a silicon nitride film 33 is deposited. The silicon nitride film 33 is formed using, for example, a CVD method. The thickness thereof is, for example, about 30 nm.

Then, over the main surface of the semiconductor substrate 1, an interlayer insulation film 34 is formed. The interlayer insulation film 34 is a TEOS (Tetra Ethyl Ortho Silicate; $Si(OC_2H_5)_4$) film formed using, for example, a plasma CVD method. Subsequently, the surface of the interlayer insulation film 34 is planarized using, for example, a CMP method. Then, using a lithography method and a dry etching method, coupling holes 35 are formed in the silicon nitride film 33 and the interlayer insulation film 34.

Then, over the interlayer insulation film 34 including the inner walls (the side surfaces and the bottom surfaces) of the coupling holes 35, using, for example, a sputtering method, a titanium nitride (TiN) film 36a is formed. The titanium nitride (TiN) film 36a has a so-called barrier function of preventing the diffusion of the material to be embedded in the insides of the coupling holes 35 in, for example, a later step. Subsequently, over the main surface of the semiconductor substrate 1, a tungsten (W) film 36b is formed in such a manner as to fill the insides of the coupling holes 35. The tungsten (W) film 36b is formed using, for example, a CVD method. Subsequently, the tungsten (W) film 36b and the titanium nitride (TiN) film 36a are ground using, for example, a CMP method, thereby to form a plug 36 in the inside of each coupling hole 35.

Then, over the main surface of the semiconductor substrate 1, a metal film such an aluminum (Al) film or a tungsten (W) film is deposited. This is processed using a lithography method and a dry etching method, thereby to form wires 37. Then, wires at still higher layers are formed, but a description thereon is omitted. By the manufacturing steps up to this point, the field effect transistors (nMISs and pMISs) in accordance with one embodiment of the present invention are roughly completed.

Thus, in accordance with the present embodiment, even when two types of oxide films with mutually different thicknesses (the first oxide film and the second oxide film 9) are formed by repeatedly performing wet etching, a divot is not formed in each end of the top surfaces of the trench type element isolation films 6L and 6S embedded in their respective insides of the trenches 4L and 4S (each portion of the top surfaces of the trench element isolation films 6L and 6S along their respective inner walls of the trenches 4L and 4S). Accordingly, the end of the main surface of the semiconductor substrate 1 in the active region is not surrounded by the gate insulation film 10n or 10p and the gate electrode 12. As a result, when the field effect transistor operates, the electric field from the gate electrode 12 does not strongly act on the end of the main surface of the semiconductor substrate 1 in the active region. For this reason, it is possible to obtain the desirable threshold voltage of the field effect transistor.

Further, even when two types of oxide films with mutually different thicknesses (the first oxide film and the second oxide film 9) are formed by repeatedly performing a heat treatment method, oxidized species such as oxidized molecules or water molecules are captured by the diffusion preventive films 20, and become less likely to intrude into the trench type element isolation films 6L and 6S for the following reason: the top surfaces of the trench type element isolation films 6L and 6S embedded in their respective insides of the trenches 4L and 4S are covered with the diffusion preventive films 20 including a silicon film or a silicon-rich oxide film. As a result, it is possible to prevent the oxidation reaction between the trench type element isolation films 6L and 6S and the semiconductor substrate 1. This can prevent the occurrence of a stress caused by the formation of an oxide film due to the oxidation reaction. Accordingly, it is possible to suppress the change in speed of electrons in the semiconductor substrate 1 due to the stress. For this reason, it is possible to suppress the change in operation speed of the field effect transistor. Further, the oxidized species contained in the trench type element isolation films 6L and 6S also become less likely to be released. This can suppress the variation in threshold voltage of the field effect transistor due to the diffusion of the oxidized species contained in the trench type element isolation films 6L and 6S into the High-k films 23n and 23p and the titanium nitride (TiN) film 25 forming the gate electrode 12.

Incidentally, in the present embodiment, each composition of the trench type element isolation films 6L and 6S formed in such a manner as to be embedded in their respective insides of the trenches 4L and 4S was set as the stoichiometric composition ($SiO_2$); the composition of the diffusion preventive film 20 covering each top surface of the trench type element isolation films 6L and 6S, as $SiO_x$ ($0 \leq x < 2$); and each composition of the silicon oxide films 21L and 21S formed over the top surfaces of the diffusion preventive films 20, as the stoichiometric composition ($SiO_2$). However, the compositions are not limited thereto. For example, when each composition of the trench type element isolation films 6L and 6S or the silicon oxide films 21L and 21S deviates from the stoichiometric composition ($SiO_2$), it is essential only that the composition of the diffusion preventive film 20 is set as a composition with a higher silicon ratio (composition with a lower oxygen ratio) than that of each composition of the trench type element isolation films 6L and 6S or the silicon oxide films 21L and 21S.

Up to this point, the invention made by the present inventors was described specifically by way of embodiments. However, it is naturally understood that the present invention is not limited to the embodiments, and may be variously changed within the scope not deviating from the gist thereof.

The present invention is applicable to a semiconductor device having a field effect transistor formed in an active region surrounded by a trench type element isolation part formed in the main surface of a semiconductor substrate.

What is claimed is:

1. A semiconductor device, comprising:
in a prescribed region of a main surface of a semiconductor substrate, an element isolation part including a trench having a prescribed width, an underlying silicon oxide film embedded in the inside of the trench, a silicon film or a silicon-rich oxide film formed over the top surface of the underlying silicon oxide film, and an overlying silicon oxide film formed over the top surface of the silicon film or the silicon-rich oxide film; and in an active region of the semiconductor substrate surrounded by the element isolation part, a field effect transistor including a gate insulation film including a lamination film of a gate oxide film and a High-k film formed sequentially from the bottom over the main surface of the semiconductor substrate, a gate electrode including a metal film over the top surface of the gate insulation film, a sidewall formed at the side surfaces of the High-k film and the gate electrode, and semiconductor regions formed in the semiconductor substrate on the opposite sides of the gate electrode, wherein the thickness of the overlying silicon oxide film is smaller than the thickness of the silicon film or the silicon-rich oxide film, wherein the thickness of the silicon film or the silicon-rich oxide film is smaller than the thickness of the underlying silicon oxide film, and wherein the ratio of silicon to oxygen in the silicon film or the silicon-rich oxide film is larger than each ratio of silicon to oxygen in the underlying silicon oxide film and the overlying silicon oxide film.

2. The semiconductor device according to claim 1,
wherein each composition of the underlying silicon oxide film and the overlying silicon oxide film is $SiO_2$, and
wherein the composition of the silicon-rich oxide film is $SiO_x$ ($0<x<2$).

3. The semiconductor device according to claim 1,
wherein the thickness of the silicon film or the silicon-rich oxide film is 3 to 20 nm.

4. The semiconductor device according to claim 1,
wherein the thickness of the silicon film or the silicon-rich oxide film is 10 to 20 nm.

5. The semiconductor device according to claim 1,
wherein the thickness of the overlying silicon oxide film is 0.5 to 2 nm.

6. The semiconductor device according to claim 1,
wherein the position of the top surface of the underlying silicon oxide film is equal to the position of the main surface of the semiconductor substrate in which the trench is not formed.

7. The semiconductor device according to claim 1,
wherein the position of the top surface of the underlying silicon oxide film is lower than the position of the main surface of the semiconductor substrate in which the trench is not formed.

8. The semiconductor device according to claim 1,
wherein an inner wall oxide film with a thickness of 5 to 20 nm is formed between the underlying silicon oxide film and the inner wall of the trench.

9. The semiconductor device according to claim 1,
wherein a cap film containing lanthanum or aluminum is formed between the High-k film and the metal film.

10. The semiconductor device according to claim 1,
wherein the field effect transistor further has a polycrystalline silicon film formed over the top surface of the metal film, and a silicide film formed over each top surface of the polycrystalline silicon film and the semiconductor regions.

11. A method for manufacturing a semiconductor device, comprising the steps of:
(a) forming a pad insulation film and a mask insulation film sequentially from the bottom over a main surface of a semiconductor substrate;
(b) removing the mask insulation film, the pad insulation film, and the semiconductor substrate in a prescribed region, and forming a trench having a prescribed width and depth in the main surface of the semiconductor substrate;
(c) forming an inner wall oxide film at the inner wall of the trench;
(d) forming an underlying silicon oxide film over the main surface of the semiconductor substrate including the inside of the trench;
(e) with the mask insulation film as a stopper film, polishing the surface of the underlying silicon oxide film, and removing the underlying silicon oxide film in a region in which the trench is not formed;
(f) processing the underlying silicon oxide film such that the position of the top surface of the underlying silicon oxide film in a region in which the trench is formed is equal to the position of the main surface of the semiconductor substrate in which the trench is not formed, or lower than the position of the main surface of the semiconductor substrate in which the trench is not formed;
(g) after the step (f), forming a silicon film or a silicon-rich oxide film over the main surface of the semiconductor substrate;
(h) after the step (g), forming an overlying silicon oxide film over the main surface of the semiconductor substrate;
(i) with the mask insulation film as a stopper film, polishing the surface of the overlying silicon oxide film, and removing the overlying silicon oxide film in a region in which the trench is not formed;
(j) removing the silicon film or the silicon-rich oxide film over the top surface of the mask insulation film;
(k) processing the overlying silicon oxide film in the region in which the trench is formed into a prescribed thickness;
(l) removing the mask insulation film, the pad insulation film, and the silicon film or the silicon-rich film at the side surface of the overlying silicon oxide film;
(m) forming a gate oxide film over the main surface of the semiconductor substrate in which the trench is not formed; and
(n) after the step (m), forming a High-k film over the main surface of the semiconductor substrate,
wherein in the step (n), the thickness of the overlying silicon oxide film is smaller than the thickness of the silicon film or the silicon-rich oxide film,
wherein the thickness of the silicon film or the silicon-rich oxide film is smaller than the thickness of the underlying silicon oxide film, and
wherein the ratio of silicon to oxygen in the silicon film or the silicon-rich oxide film is larger than the ratio of silicon to oxygen in the underlying silicon oxide film or the overlying silicon oxide film.

12. The method for manufacturing a semiconductor device according to claim 11,
wherein the underlying silicon oxide film or the overlying silicon oxide film is formed by forming polysilazane using a coating method, and then performing a heat treatment in a water vapor atmosphere.

13. The method for manufacturing a semiconductor device according to claim 11,
wherein the underlying silicon oxide film or the overlying silicon oxide film is formed using a silanol type material.

14. The method for manufacturing a semiconductor device according to claim 11,
wherein the underlying silicon oxide film or the overlying silicon oxide film is formed using a SA-CVD method or a HDP-CVD method.

15. The method for manufacturing a semiconductor device according to claim 11,
wherein the silicon film or the silicon-rich oxide film is formed by a HDP-CVD method.

16. The method for manufacturing a semiconductor device according to claim 11,
wherein each composition of the underlying silicon oxide film and the overlying silicon oxide film is $SiO_2$, and
wherein the composition of the silicon-rich oxide film is $SiO_x$ ($0<x<2$).

17. The method for manufacturing a semiconductor device according to claim 11,
wherein the thickness of the silicon film or the silicon-rich oxide film is 3 to 20 nm.

18. The method for manufacturing a semiconductor device according to claim 11,
wherein the thickness of the silicon film or the silicon-rich oxide film is 10 to 20 nm.

19. The method for manufacturing a semiconductor device according to claim 11,
wherein the thickness of the overlying silicon oxide film in the step (n) is 0.5 to 2 nm.

20. The method for manufacturing a semiconductor device according to claim 11, further comprising, after the step (n), the steps of:
(o) forming a cap film, a metal film, and a polycrystalline silicon film sequentially from the bottom over the main surface of the semiconductor substrate;
(p) processing the polycrystalline silicon film, the metal film, the cap film, and the High-k film, and forming a gate electrode including the polycrystalline silicon film and the metal film, and forming a gate insulation film including the High-k film and the gate oxide film;
(q) forming semiconductor regions in the semiconductor substrate on the opposite sides of the gate electrode; and
(r) forming silicide layers over the top surfaces of the polycrystalline silicon film and the semiconductor regions.

* * * * *